United States Patent
Ho et al.

(10) Patent No.: US 10,140,407 B2
(45) Date of Patent: Nov. 27, 2018

(54) METHOD, DEVICE AND COMPUTER PROGRAM PRODUCT FOR INTEGRATED CIRCUIT LAYOUT GENERATION

(71) Applicant: TAIWAN SEMICONDUCTOR MANUFACTURING COMPANY, LTD., Hsinchu (TW)

(72) Inventors: Chia-Ming Ho, Hsinchu (TW); Adari Rama Bhadra Rao, Hsinchu (TW); Meng-Kai Hsu, Xinfeng Township (TW); Kuang-Hung Chang, Hsinchu (TW); Ke-Ying Su, Taipei (TW); Wen-Hao Chen, Hsinchu (TW); Hsien-Hsin Sean Lee, Duluth, GA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 611 days.

(21) Appl. No.: 14/555,191

(22) Filed: Nov. 26, 2014

(65) Prior Publication Data

US 2016/0147928 A1    May 26, 2016

(51) Int. Cl.
*G06F 17/50* (2006.01)

(52) U.S. Cl.
CPC ...... *G06F 17/5072* (2013.01); *G06F 17/5081* (2013.01)

(58) Field of Classification Search
CPC .................... G06F 17/5072; G06F 17/5081
See application file for complete search history.

(56) References Cited

U.S. PATENT DOCUMENTS

| | | | |
|---|---|---|---|
| 5,629,838 A | 5/1997 | Knight et al. | |
| 7,801,717 B2 | 9/2010 | Chang et al. | |
| 8,307,321 B2 | 11/2012 | Liu et al. | |
| 8,456,009 B2 | 6/2013 | Su et al. | |
| 2003/0049945 A1* | 3/2003 | Hyoto | H01L 21/7682 438/708 |
| 2003/0237066 A1* | 12/2003 | Ito | G06F 17/5077 716/112 |

(Continued)

FOREIGN PATENT DOCUMENTS

| | | |
|---|---|---|
| CN | 101364595 | 2/2009 |
| JP | 2003-78015 | 3/2003 |

(Continued)

OTHER PUBLICATIONS

Office Action dated Oct. 31, 2016 from corresponding application No. TW 104137688.

(Continued)

*Primary Examiner* — Vuthe Siek
*Assistant Examiner* — Aric Lin
(74) *Attorney, Agent, or Firm* — Hauptman Ham, LLP

(57) ABSTRACT

A method performed at least partially by a processor includes performing an air gap insertion process. The air gap insertion process includes sorting a plurality of nets of a layout of an integrated circuit in an order, and inserting, in accordance with the sorted order of the plurality of nets, air gap patterns adjacent to the plurality of nets. The method further includes generating a modified layout of the integrated circuit. The modified layout includes the plurality of nets and the inserted air gap patterns.

20 Claims, 11 Drawing Sheets

(56) References Cited

U.S. PATENT DOCUMENTS

| | | | |
|---|---|---|---|
| 2005/0273743 A1* | 12/2005 | Ikeda | G06F 17/5077 716/113 |
| 2007/0240086 A1 | 10/2007 | Sinha et al. | |
| 2008/0097641 A1* | 4/2008 | Miyashita | G06F 17/5031 700/121 |
| 2008/0120583 A1* | 5/2008 | Fujii | G06F 17/5068 716/112 |
| 2008/0197449 A1 | 8/2008 | Araki et al. | |
| 2009/0044164 A1* | 2/2009 | Lee | H01L 21/32139 716/119 |
| 2009/0077507 A1 | 3/2009 | Hou et al. | |
| 2011/0315527 A1 | 12/2011 | Dang et al. | |

FOREIGN PATENT DOCUMENTS

| | | |
|---|---|---|
| JP | 2008-103610 | 5/2008 |
| JP | 2008-205283 | 9/2008 |

OTHER PUBLICATIONS

Search Report dated Oct. 15, 2016 from corresponding application No. TW 104137688.
Office Action dated Aug. 9, 2016 and English translation from corresponding No. KR 10-2015-0095243.
Office Action dated Apr. 4, 2018 from corresponding application No. CN201510666871.1.

* cited by examiner

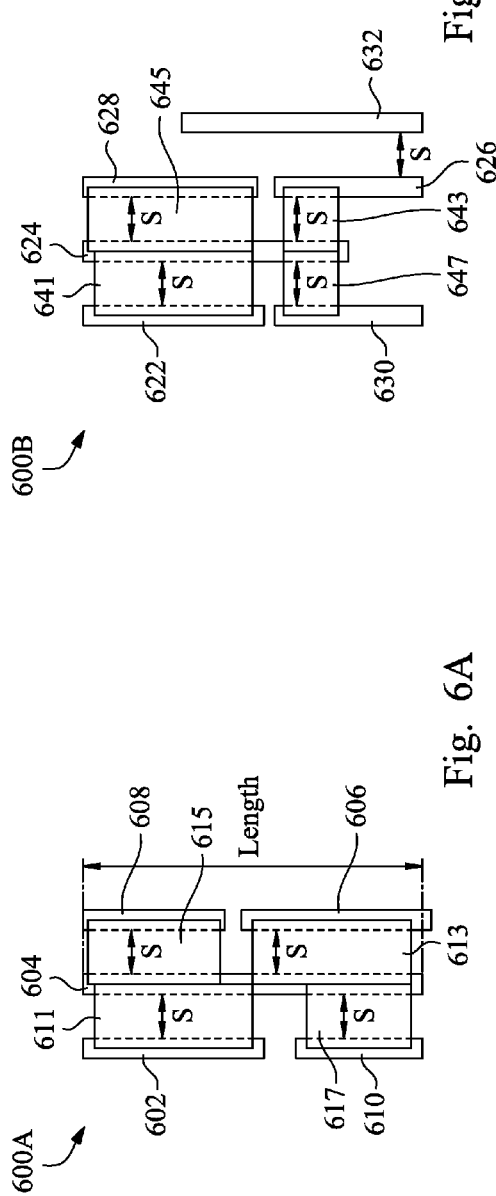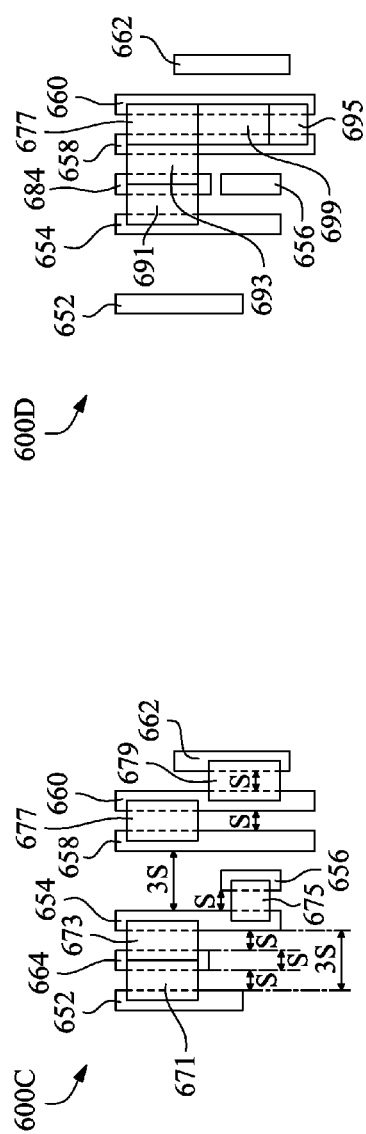

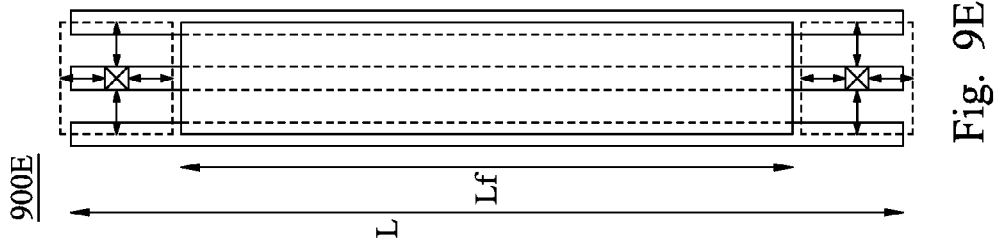
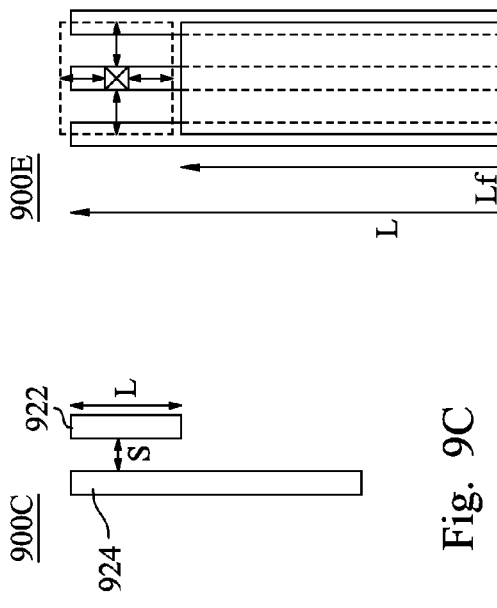
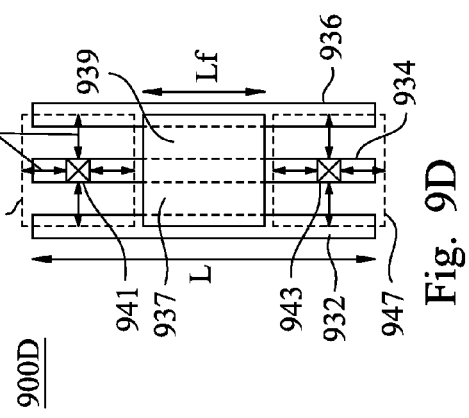
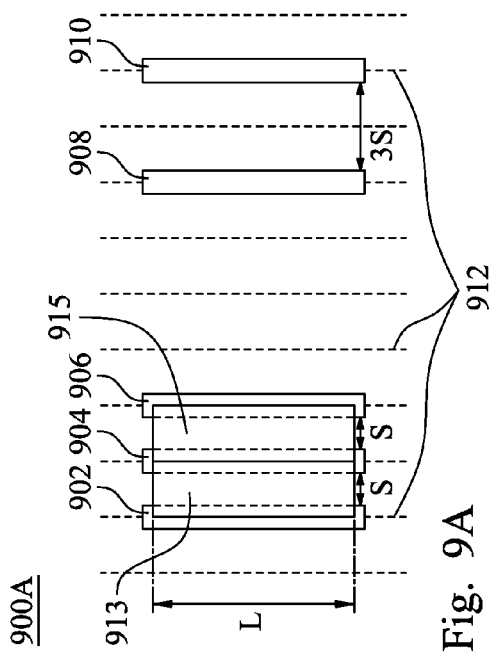
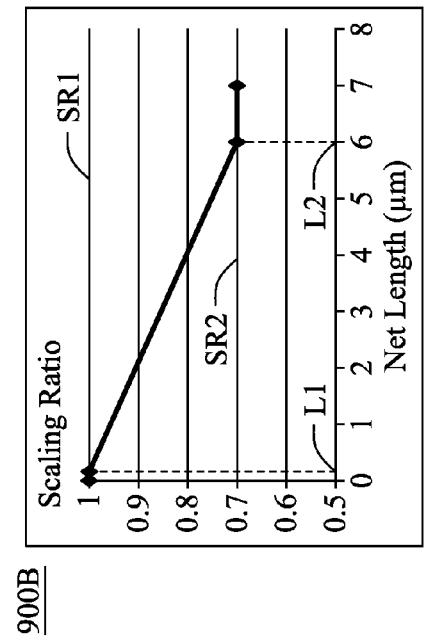

METHOD, DEVICE AND COMPUTER PROGRAM PRODUCT FOR INTEGRATED CIRCUIT LAYOUT GENERATION

BACKGROUND

The recent trend in miniaturizing integrated circuits (ICs) has resulted in smaller devices which consume less power, yet provide more functionality at higher speeds. The miniaturization process has also resulted in stricter design and/or manufacturing specifications. Various electronic design automation (EDA) processes are developed to generate, optimize and verify IC designs while ensuring that the design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6D are schematic, plan views of various portions of IC layouts, in accordance with some embodiments.

FIG. 9A is a schematic, plan view of a portion of a layout for an IC, in accordance with some embodiments.

FIG. 9B is a graph for determining a scaling ratio used by an EDA tool in an IC design process, in accordance with some embodiments.

FIGS. 9C-9E are schematic, plan views of various portions of IC layouts, in accordance with some embodiments.

DETAILED DESCRIPTION

Figure 1:
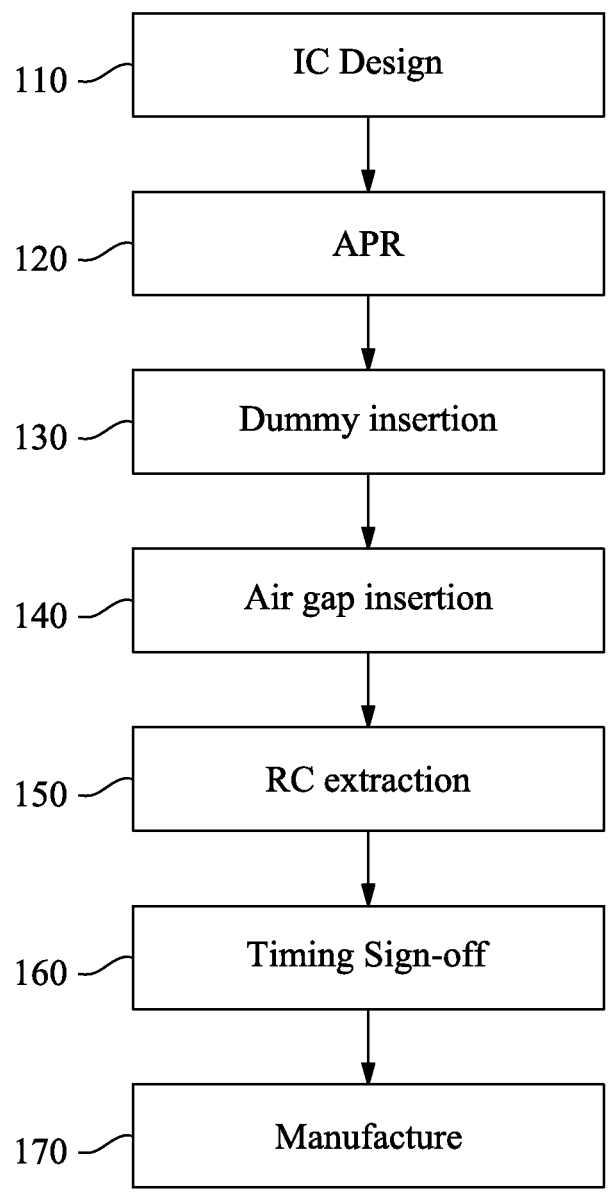
FIG. 1 is a functional flow chart of at least a portion of an IC design process, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a functional flow chart of at least a portion of an design process 100, in accordance with some embodiments. The design process 100 utilizes one or more EDA tools for generating, optimizing and/or verifying a design of an IC before manufacturing the IC. The EDA tools, in some embodiments, are one or more sets of executable instructions for execution by at least one processor configured to perform the indicated functionality, as described herein.

At operation 110, a design of an IC is provided by a circuit designer. In some embodiments, the design of the IC comprises a schematic, i.e., an electrical diagram, of the IC. In some embodiments, the schematic is generated or provided in the form of a schematic netlist, such as a Simulation Program with Integrated Circuit Emphasis (SPICE) netlist. In some embodiments, a pre-layout simulation is performed on the design to determine whether the design meets a predetermined specification. When the design does not meet the predetermined specification, the IC is redesigned. In at least one embodiment, a pre-layout simulation is omitted.

At operation 120, a layout of the IC is generated based on the design. The layout comprises the physical positions of various circuit elements of the IC as well as the physical positions of various nets interconnecting the circuit elements. For example, the layout is generated in the form of a Graphic Design System (GDS) file. Other data formats for describing the design are within the scope of various embodiments. In some embodiments, the layout is generated by an Automatic Placement and Routing (APR) tool. A configuration and functionality of an example APR tool in accordance with some embodiments is described with respect to FIG. 8.

At operation 130, a dummy insertion process is performed to insert dummy features into the layout. In at least one embodiment, a purpose of the dummy feature insertion is to improve production yield and/or quality. For example, IC production involves various processes including, but not limited to, deposition, photolithography, etching, chemical mechanical polishing (CMP), and the like. A CMP process is performed to etch back and planarize conductive material and/or dielectric material, and involves chemical etching and mechanical grinding in the material removal process. In some embodiments, the insertion of dummy features improves a density of conductive material, e.g., metal, in the IC being manufactured to achieve a mechanical strength sufficient to ensure CMP quality. In another example, when adjacent conductive patterns are widely spaced from each other by a spacing greater than a predetermined value, the metal bias effect potentially occurs during manufacture and causes the widths of the widely spaced conductive patterns to become wider than initially designed which, in turn, causes unintended variations in resistance, capacitance and/or circuit performance. In some embodiments, the insertion of dummy features between widely spaced conductive patterns reduces the likelihood of the metal bias effect and improves quality and/or performance of the manufactured IC. In at least one embodiment, the dummy insertion process is performed by the APR tool and/or a design-rule-checking (DRC) tool described herein. Example dummy insertion processes are described in U.S. Pat. No. 7,801,717 and 8,307,321, which are incorporated by reference herein in their entirety. Further example dummy insertion processes in accordance with some embodiments are described with respect to FIGS. 5 and 6A-6D.

At operation 140, an air gap insertion process is performed to insert air gap patterns into the layout. The air gap patterns inserted in the layout will result in air gaps being formed in the manufactured IC for reducing parasitic capacitance and improving performance of the manufactured IC, as described with respect to FIGS. 2A-2B. Example air gap insertion processes in accordance with some embodiments are described with respect to FIGS. 3 and 4A-4D.

At operation 150, a resistance and capacitance (RC) extraction is performed by an RC extraction tool. The RC extraction is run to determine parasitic parameters, e.g., parasitic resistance and parasitic capacitance, of components in the IC for timing and/or power simulations in a subsequent operation. Such parasitic parameters are not intended by the circuit designer, but nevertheless occur as a result of configurations and/or materials of various components in the IC. The extracted parasitic parameters are included in an RC technology file. A configuration and functionality of an example RC extraction tool in accordance with some embodiments is described with respect to FIG. 10.

In some embodiments, one or more verifications and/or checks is/are performed. For example, a layout-versus-schematic (LVS) check, is performed to ensure that the generated layout corresponds to the design. For another example, a design rule check is performed by a DRC tool to ensure that the layout satisfies certain manufacturing design rules, i.e., to ensure that the IC can be manufactured. When one of the checks fails, correction is made to at least one of the layout or the design by returning the process to operation 110 and/or operation 120.

At operation 160, a timing sign-off check (also referred to as a post-layout simulation) is performed to determine whether the layout meets a predetermined specification. In some embodiments, when the post-layout simulation indicates that the layout does not meet the predetermined specification, e.g., when there are undesirable time delays, correction is made to at least one of the layout or the design by returning the process to any of operations 110-140. Otherwise, the layout is passed to manufacture at operation 170. In some embodiments, one or more of the above-described operations are omitted.

Figure 2A:
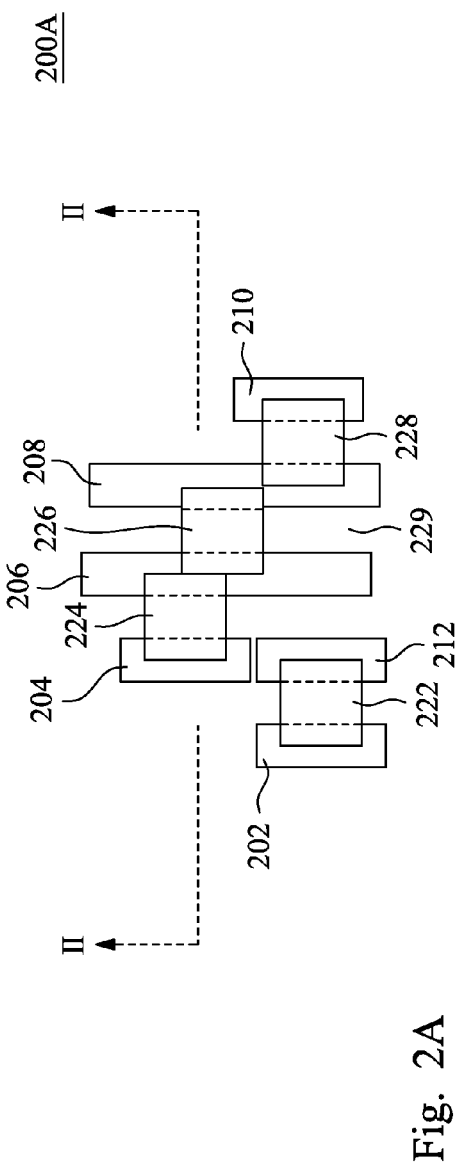
FIG. 2A is a schematic, plan view of a portion of a layout for an IC, in accordance with some embodiments.

FIG. 2A is a schematic, plan view of a portion of a layout 200A for an IC, in accordance with some embodiments. The layout 200A comprises a plurality of nets 202, 204, 206, 208, 210, and 212. The layout 200A further comprises a plurality of air gap patterns 222, 224, 226, and 228 between corresponding pairs of nets. For example, the air gap pattern 222 is located between the nets 202 and 212, the air gap pattern 224 is located between the nets 204 and 206, the air gap pattern 226 is located between the nets 206 and 208, and the air gap pattern 228 is located between the nets 208 and 210. Although not shown in FIG. 2A, the layout 200A further comprises a plurality of circuit elements interconnected by the plurality of nets. A circuit element is an active element or a passive element. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, planar MOS transistors with raised source/drains. Examples of passive elements include, but are not limited to, capacitors, inductors, fuses, and resistors. In some embodiments, a circuit element has one or more nodes, from which electrical signals are inputted into or outputted from the circuit element. In some embodiments, a pair of nodes is electrically connected to each other by an interconnection. A set of electrically connected interconnections forms a net. In at least one embodiment, a net comprises a single interconnection. In at least one embodiment, the IC comprises a number of alternatingly arranged conductive and dielectric layers. The interconnections are formed in the conductive layers. In at least one embodiment, a net comprises an interconnection or interconnections formed in a single conductive layer. In at least one embodiment, a net comprises interconnections formed in different conductive layers of the IC, and one or more vias electrically connecting the interconnections formed in the different conductive layers. For simplicity, various nets in example embodiments described herein are illustrated in one or more drawings as including a single interconnection and/or formed in a single conductive layer. The description herein is applicable to embodiments where nets include more than one interconnection and/or are formed in a more than one conductive layer.

The plurality of nets comprises signal nets 202, 204, 206, 208 and 210, and a dummy net 212. A signal net is a net configured to transmit a signal or power to a circuit element. Examples of signals include, but are not limited to, data signals, control signals, clock signals and the like. A dummy net is a net not configured to transmit a signal or power. For example, a dummy net is a floating net. In the description herein, unless otherwise specified, "nets" refer to both "signal nets" and "dummy nets."

The air gap patterns 222, 224, 226, and 228 are patterns in a mask layer included in the layout 200A. The air gap patterns 222, 224, 226, and 228 cover corresponding spaces between adjacent nets. For example, the air gap pattern 222 covers the space between adjacent nets 202, 212. When the IC is manufactured, a dielectric material is prevented from being formed in the spaces covered by air gap patterns 222, 224, 226, and 228, resulting in corresponding air gaps between adjacent nets, for example, as described with respect to FIG. 2B.

Figure 2B:
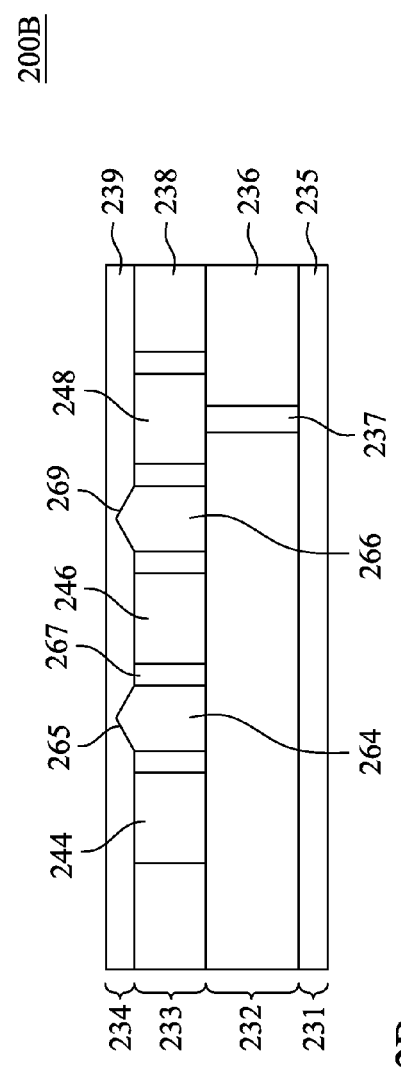
FIG. 2B is a schematic, cross-sectional view of a portion of a manufactured IC, in accordance with some embodiments.

FIG. 2B is a schematic, cross-sectional view of a portion of a manufactured IC 200B, in accordance with some embodiments. In the example configuration in FIG. 2B, the portion of the manufactured IC 200B corresponds to a cross-section view taken along line II-II in FIG. 2A. The manufactured IC 200B comprises a plurality of alternatingly arranged conductive layers 231, 233 and dielectric layers 232, 234. For example, the dielectric layer 232 is arranged over the conductive layer 231, the conductive layer 233 is arranged over the dielectric layer 232, and the dielectric layer 234 is arranged over the conductive layer 233. The conductive layer 231 comprises a conductive pattern 235 electrically connected to a underlying conductive layer or circuit element. The conductive pattern 235 is electrically coupled to a conductive via 237 in a dielectric material 236 of the dielectric layer 232. The conductive layer 233 comprises a plurality of conductive patterns 244, 246, 248 in a dielectric material 238. The conductive pattern 248 is electrically coupled to the conductive pattern 235 by the conductive via 237 to form a net in multiple conductive layers, as described herein. The conductive patterns 244, 246, 248 correspond to the nets 204, 206 and 208 in the layout 200A of FIG. 2A. An air gap 264 is between the conductive patterns 244 and 246. An air gap 266 is between the conductive patterns 246 and 248. The air gaps 244, 246 correspond to air gap patterns 224, 226 in the layout 200A of FIG. 2A. Due to process variations and/or material properties, portions of a dielectric material are present between the air gaps and the corresponding conductive patterns, in one or more embodiments. For example, although the air gap pattern 224 in the layout 200A covers, from edge to edge, the space between nets 204, 206, portions 265, 267 of the dielectric material 238 are still present in the covered space, between the air gap 264 and the corresponding conductive patterns 244, 246. In some embodiments, the air gaps extend, from edge to edge, between the corresponding conductive patterns, e.g., portions 265, 267 of the dielectric material 238 are not present in the manufactured IC. A region between adjacent conductive patterns that is not covered by an air gap pattern is filled with dielectric material. For example, a region 229 in the layout 200A of FIG. 2A is not covered by an air gap pattern and will be filled with the dielectric material 238 in the manufactured IC 200B. A dielectric material 239 of the dielectric layer 234 is over the conductive layer 233. Due to one or more factors related to the material and/or process for forming the dielectric material 239, top portions of the air gaps protrude into the dielectric material 239, in at least one embodiment. For example, a top portion 269 of the air gap 266 protrudes into the dielectric material 239. Example materials of the conductive patterns 235, 244, 246, 248 and/or conductive via 237 include metals, such as copper. Example materials of the dielectric materials 236, 238, 239 include, but are not limited to, SiNx, SiOx, SiON, SiC, SiBN, SiCBN, or combinations thereof. Example processes for air gap formation are described in in U.S. Pat. No. 8,456,009, which is incorporated by reference herein in its entirety. The described configuration of the manufactured IC is an example. Other configurations are within the scope of various embodiments.

For circuitry miniaturization purposes, the density of conductive structures, such as interconnections and circuit elements, in an IC increases, and sizes of the interconnections and circuit elements decrease. As a result, parasitic capacitances between conductive structures potentially increase which, in turn, potentially increase power consumption and/or time delays of signals transmitted among various circuit elements of the IC. The parasitic capacitances between conductive structures depend on the dielectric constant of the insulation between the conductive structures. Because the dielectric constant of air (about 1) is lower than the dielectric constants of various dielectric materials, air gaps are formed, in addition to dielectric materials, between conductive structures of an IC to reduce the overall, effective dielectric constant of the insulation between adjacent conductive structures, and to reduce parasitic capacitances. In some embodiments, "air gap" comprises air, vacuum, a gas or a substance having a dielectric constant lower than the dielectric constant of the dielectric material(s) formed between conductive structures of an IC. The air gap formation is subject to one or more air gap constraints as described herein. Some embodiments provide various air gap insertion methodologies for maximizing, optimizing or increasing the effect of parasitic capacitance reduction, while satisfying the air gap constraints.

Figure 3:
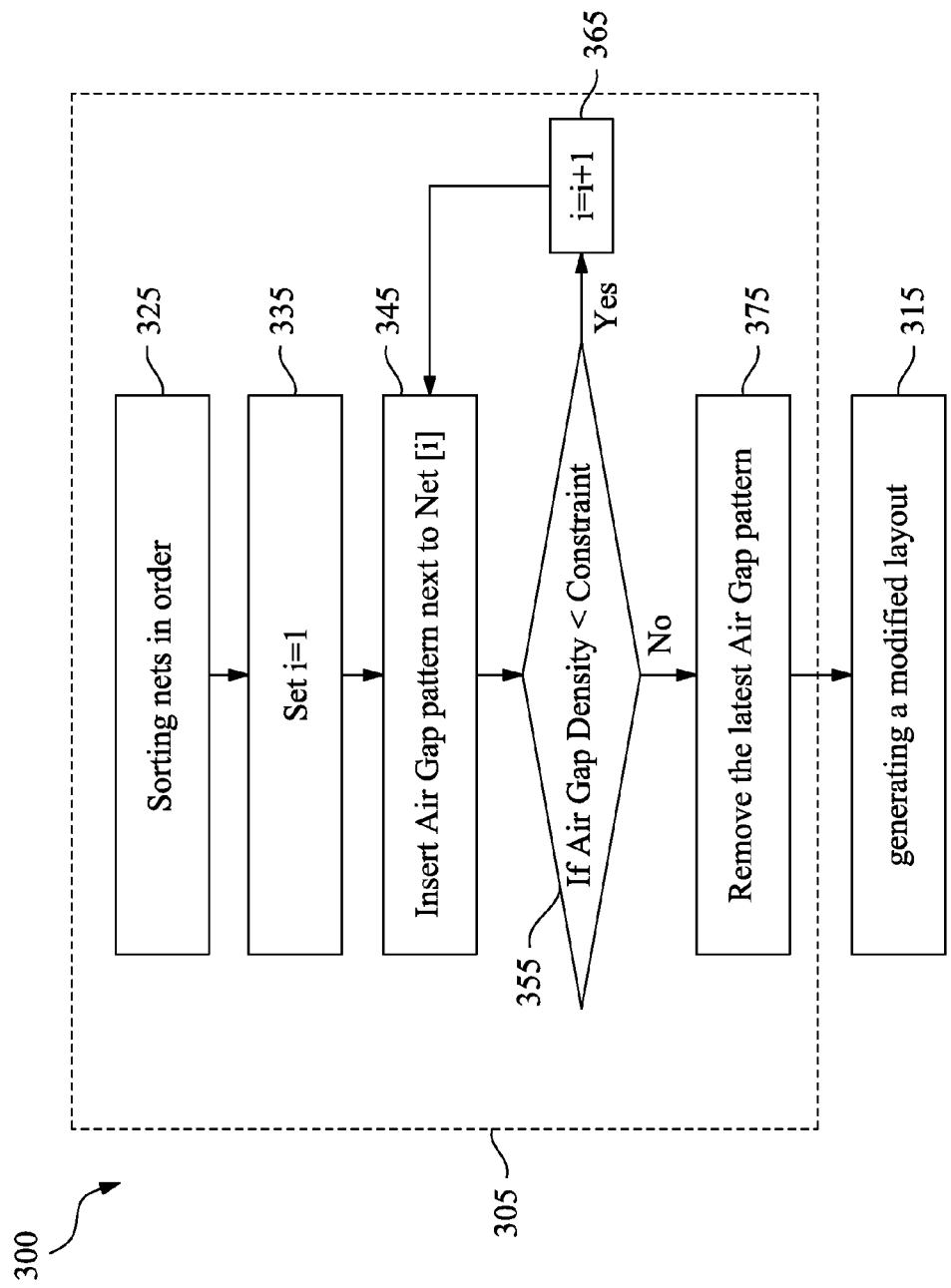
FIG. 3 is a flow chart of an air gap insertion method, in accordance with some embodiments.

FIG. 3 is a flow chart of an air gap insertion method 300, in accordance with some embodiments. FIGS. 4A-4D are schematic, plan views of various portions of IC layouts 400A-400D for illustrating various implementations of the method 300, in accordance with some embodiments. The method 300 comprises an air gap insertion process 305 in which air gap patterns are inserted adjacent to a plurality of nets of a layout of an IC. The method 300 further comprises operation 315 in which a modified layout comprising the plurality of nets and the inserted air gap patterns is generated.

Figure 4B:
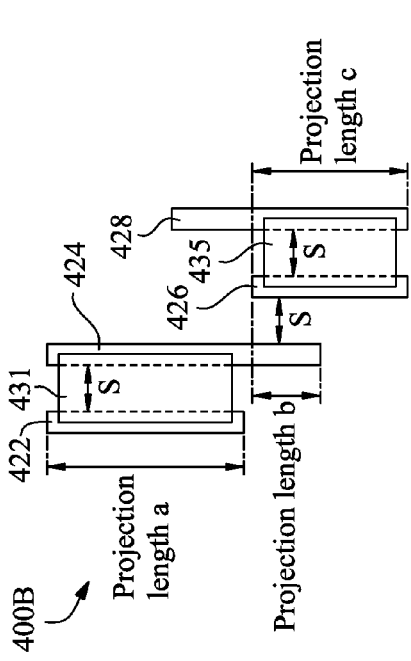
FIGS. 4A-4D are schematic, plan views of various portions of IC layouts, in accordance with some embodiments.

At operation 325 of the air gap insertion process 305 in FIG. 3, the plurality of nets in the layout, or a portion of the layout, of the integrated circuit is sorted in an order. In some embodiments, the plurality of nets is sorted by corresponding lengths (also referred to herein as net lengths) of the nets. For example, as illustrated in FIG. 4A, a layer of the layout 400A comprises nets 402, 404, 406. The net 404 is adjacent to the nets 402, 406, and is spaced from the nets 402, 406 by an edge-to-edge spacing s. For example, the spacing s is the distance between an edge 407 of the net 402 and an edge 408 of the net 404. The spacing s satisfies a constraint for air gap insertion. For example, the spacing s is equal to or less than a maximum spacing for air gap insertion. When a spacing between adjacent nets is greater than a maximum spacing for air gap insertion, an air gap pattern is not inserted between the adjacent nets. In at least one embodiment, the spacing s is the minimum spacing between adjacent nets permitted by a design and/or manufacture specification of the IC, and air gaps are permitted to be inserted only between adjacent nets with the spacing s. In the example configuration in FIG. 4A, a length of the net 404 (which is indicated as "Length" in FIG. 4A) is greater than a length of the net 402 which, in turn, is greater than a length of the net 406. The nets 402, 404, 406 are sorted in the order of the corresponding lengths, i.e., in the following order of net 404, net 402, net 406.

After sorting the plurality of nets, air gap patterns are inserted, in accordance with the sorted order of the plurality of nets, adjacent to the plurality of nets. For example, at operation 335 of the air gap insertion process 305 in FIG. 3, an index i is set to 1. This corresponds to selecting the first net among the sorted nets of the IC for air gap insertion. In the example configuration in FIG. 4A, the net 404 with the longest length is selected for air gap insertion before the other nets 402, 406 with shorter lengths.

At operation 345 of the air gap insertion process 305 in FIG. 3, at least one air gap pattern is inserted adjacent to the currently selected net, i.e., Net[i]. In the example configuration in FIG. 4A, air gap patterns 411, 413 are inserted adjacent to the currently selected net 404. The air gap pattern 411 is inserted between the currently selected net 404 and the adjacent net 402 to reduce a parasitic capacitance between the nets 402, 404. The air gap pattern 413 is inserted between the currently selected net 404 and the other adjacent net 406 to reduce a parasitic capacitance between the nets 404, 406.

At operation 355 of the air gap insertion process 305 in FIG. 3, it is determined whether the air gap patterns that have been inserted satisfy a constraint. In the example configuration in FIG. 4A, it is determined whether the air gap patterns 411, 413 that have been inserted satisfy a constraint. In some embodiments, the constraint comprises the air gap density, i.e., the ratio of an overall area of air gaps covered by the inserted air gap patterns to an overall area of the layer in which air gaps are to be formed. The overall area of the layer comprises areas of the conductive structures (e.g., nets) in the layer, and areas of the insulation (e.g., air gaps and dielectric materials) between the nets. When the air gap density of the air gap patterns that have been inserted is greater than a predetermined air gap density constraint, a mechanical strength of the layer is potentially insufficient to withstand stress during manufacture and/or in the final product. In some embodiments, the air gap density constraint is 50%. Other air gap density constraint values and/or constraints other than air gap density are within the scope of various embodiments.

At operation 365 of the air gap insertion process 305 in FIG. 3, in response to a determination that the air gap patterns that have been inserted satisfy the constraint (Yes at operation 355), the index i is incremented. This corresponds to selecting the next net among the sorted nets of the IC for air gap insertion. In the example configuration in FIG. 4A, the next net, i.e., the net 402 is selected for air gap insertion. The process then returns to operation 345 at which at least one air gap pattern is inserted adjacent to the net 402, e.g., between the net 402 and another net adjacent to the net 402. The process then proceeds to operation 355 at which it is determined whether the air gap patterns that have been inserted, i.e., the air gap patterns 411, 413 and one or more air gap patterns inserted adjacent to the net 402, satisfy the constraint. In response to a determination that the air gap patterns that have been inserted satisfy the constraint (Yes at operation 355), the index i is again incremented and operations 345 and 355 are performed for the next net, e.g., the net 406 in FIG. 4A.

At operation 375 of the air gap insertion process 305 in FIG. 3, in response to a determination that the air gap patterns that have been inserted do not satisfy the constraint (No at operation 355), the last inserted air gap pattern is removed, and then the process proceeds to operation 315 where a modified layout of the IC is generated with the remaining air gap patterns that have been inserted. For example, when the current net is the net 402 in the example configuration in FIG. 4A and operation 355 indicates that the air gap patterns that have been inserted do not satisfy the constraint, at least one air gap pattern inserted adjacent to the net 402 is removed. In some embodiments, in response to a determination that the constraint is not satisfied when several air gap patterns have been inserted adjacent to the current net, all of the air gap patterns inserted adjacent to the current net are removed. In some embodiments, in response to a determination that the constraint is not satisfied when several air gap patterns have been inserted adjacent to the current net, the air gap patterns inserted adjacent to the current net are removed one-by-one until the constraint is satisfied. Other arrangements are within the scope of various embodiments.

In some embodiments, by sorting the plurality of nets in an IC, or in a portion of the IC, in accordance with corresponding lengths of the nets, air gap patterns are inserted for nets with longer lengths before nets of shorter lengths. As a result, in one or more embodiments, the parasitic capacitance reduction is optimized for net capacitance along long nets, which potentially have greater impacts on timing delays and circuit performance than short nets. The described sorting by net length is an example. Other sorting arrangements are within the scope of various embodiments.

In some embodiments, the nets in an IC, or a portion of the IC, are sorted by projection length. A projection length of a pair adjacent nets is a length over which the adjacent nets extend along each other. In the example configuration in FIG. 4B, a projection length a of nets 422, 424 is the length over which the nets 422, 424 extend along each other. The projection length a corresponds to a length of an air gap insertable between the nets 422, 424. A projection length b of nets 424, 426 is a the length over which the nets 424, 426 extend along each other. The projection length b corresponds to a length of an air gap insertable between the nets 424, 426. A projection length c of nets 426, 428 is the length over which the nets 426, 428 extend along each other. The projection length c corresponds to a length of an air gap insertable between the nets 426, 428. In the example configuration in FIG. 4B, the projection length a is longer than the projection length c, which in turn, is longer than the projection length b.

In some embodiments, after sorting the nets by corresponding projection lengths, air gap patterns are inserted between nets with longer projection lengths before nets with shorted projection lengths, and the constraint is check, as described with respect to operations 335, 345, 355, 365 and 375 in FIG. 3. In the example configuration in FIG. 4B, an air gap pattern 431 is inserted between the nets 422, 424 having the longest projection length a first. It is determined whether the inserted air gap pattern 431 satisfies the constraint. Assuming that the inserted air gap pattern 431 satisfies the constraint, the process proceeds to insert an air gap pattern 435 between the nets 426, 428 with the second longest projection length c. It is determined whether the inserted air gap patterns 431, 435 satisfy the constraint. Assuming that the inserted air gap patterns 431, 435 satisfy the constraint, the process proceeds to insert an air gap pattern (illustrated, e.g., at 437 in FIG. 4C) between the nets 424, 426 with the projection length b. It is determined whether the inserted air gap patterns, e.g., the air gap patterns 431, 435 and the air gap pattern inserted between the nets 424, 426, satisfy the constraint. Assuming that the inserted air gap patterns do not satisfy the constraint, the last inserted air gap pattern (illustrated, e.g., at 437 in FIG. 4C) between the nets 424, 426 is removed. A modified layout is generated with the nets 422, 424, 426, 428 and the inserted air gap patterns 431, 435 as shown in FIG. 4B. In one or more embodiments implementing the sorting arrangement described with respect to FIG. 4B, the parasitic capacitance reduction is optimized for coupling capacitances between nets.

In some embodiments, the nets in an IC, or a portion of the IC, are sorted by a cost function. An example cost function Cost1 is a sum of projection lengths along each net, as determined by the following equation:

$$Cost1(i) = \sum_{j=1}^{N} \text{Proj\_Length}(j) \qquad (1)$$

where
i indicates an i-th net among the plurality of nets,
N is a number of nets among the plurality of nets and adjacent the i-th net,
j indicates a j-th net among the N nets adjacent the i-th net,
Proj_Length(j) is a projection length over which the i-th net and the j-th net extend along each other, and
Length(i) is a length of the i-th net.

Figure 4D:
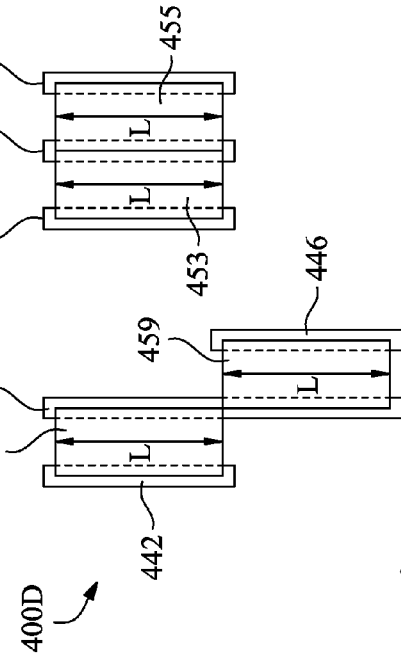
Figure 4A:
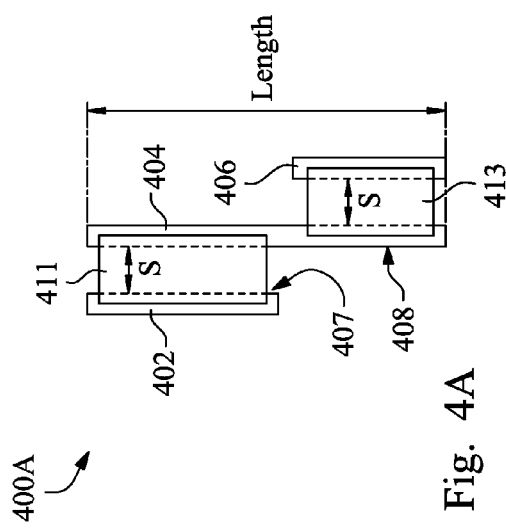
Figure 4C:
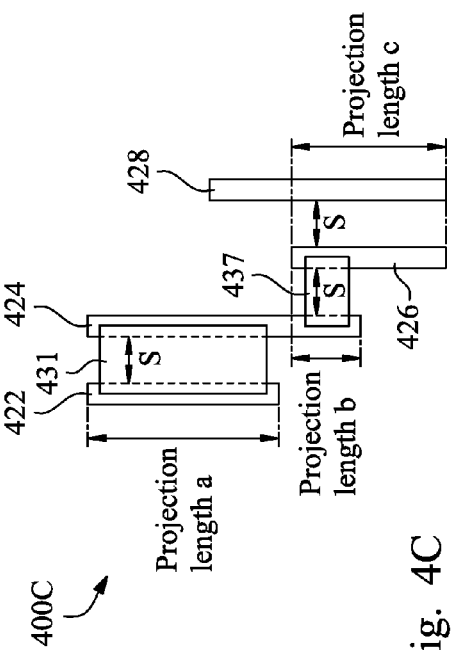

In the example configuration in FIG. 4C, the same nets 422, 424, 426 and 428 as described with respect to FIG. 4B are considered for air gap insertion. The nets 422, 424, 426 and 428 in FIG. 4C are sorted by the cost function Cost1, instead of projection length as described with respect to FIG. 4B. For the net 422, the cost function Cost1 is the projection length a. For the net 424, the cost function Cost1 is the sum of projection length a plus projection length b, which is the largest among the nets 422, 424, 426, 428. For the net 426, the cost function Cost1 is the sum of projection length b plus projection length c, which is the second largest among the nets 422, 424, 426, 428. For the net 428, the cost function Cost1 is the projection length c which is the smallest among the nets 422, 424, 426, 428. As a result, the nets are sorted in the following order: net 424, net 426, net 422, and net 428.

In some embodiments, after sorting the nets by the cost function Cost1, air gap patterns are inserted adjacent to nets with the greater Cost1 before nets with smaller Cost 1, and the constraint is check, as described with respect to operations 335, 345, 355, 365 and 375 in FIG. 3. In the example configuration in FIG. 4C, the air gap patterns 431 and 437 are inserted adjacent to the net 424 with the largest Cost1 before the other nets 422, 426, 428. It is determined whether the inserted air gap patterns 431, 437 satisfy the constraint. Assuming that the inserted air gap patterns 431, 437 satisfy the constraint, the process proceeds to insert an air gap pattern (illustrated, e.g., at 435 in FIG. 4B) between the nets 426, 428 because the net 426 has the second largest Cost1. It is determined whether the inserted air gap patterns 431, 437 and the air gap pattern inserted between the nets 426, 428, satisfy the constraint. Assuming that the inserted air gap patterns do not satisfy the constraint, the last inserted air gap pattern (illustrated, e.g., at 435 in FIG. 4B) between the nets 426, 428 is removed. A modified layout is generated with the nets 422, 424, 426, 428 and the inserted air gap patterns 431, 437 as shown in FIG. 4C. In one or more embodiments implementing the sorting arrangement using the cost function Cost1 as described with respect to FIG. 4C, the parasitic capacitance reduction is optimized for total capacitances of nets.

Another example cost function Cost2, in accordance with some embodiments, is a ratio of the cost function Cost1 of each net to the length of the net, as determined by the following equation:

$$Cost2(i) = Cost1(i)/Length(i) \quad (2)$$

In the example configuration in FIG. 4D, nets 442, 446, 448, 450 and 452 have the same length of L, and a net 444 has a length of 2L. For both the nets 444 and 450, the cost function Cost1 is 2L. However, the length of the net 444 is 2L, whereas the length of the net 450 is L. As a result, the cost function Cost2 for the net 444 is 1, and the cost function Cost2 for the net 450 is 2. When the nets are sorted by the cost function Cost2, the net 450 with the larger Cost2 is ranked higher than the net 444 with the smaller Cost2.

In some embodiments, after sorting the nets by the cost function Cost2, air gap patterns are inserted adjacent to nets with the greater Cost2 before nets with smaller Cost 2, and the constraint is check, as described with respect to operations 335, 345, 355, 365 and 375 in FIG. 3. For example, air gap patterns 453, 455 are inserted adjacent to the higher ranked net 450 before air gap patterns 457, 459 are inserted adjacent to the lower ranked net 444. In one or more embodiments implementing the sorting arrangement using the cost function Cost2 as described with respect to FIG. 4D, the parasitic capacitance reduction is optimized for a ratio of total capacitances of nets to net lengths.

The described sorting arrangements are examples. Other sorting arrangements are within the scope of various embodiments. In some embodiments, different sorting arrangements are applied to different portions of an IC. In some embodiments, when a sorting arrangement results in air gap patterns that do not pass a verification or check at a later stage, another sorting arrangement is applied to re-generate the air gap patterns.

In some embodiments, a parasitic capacitance reduction optimization process involves not only air gap insertion, but also dummy net insertion.

Figure 5:
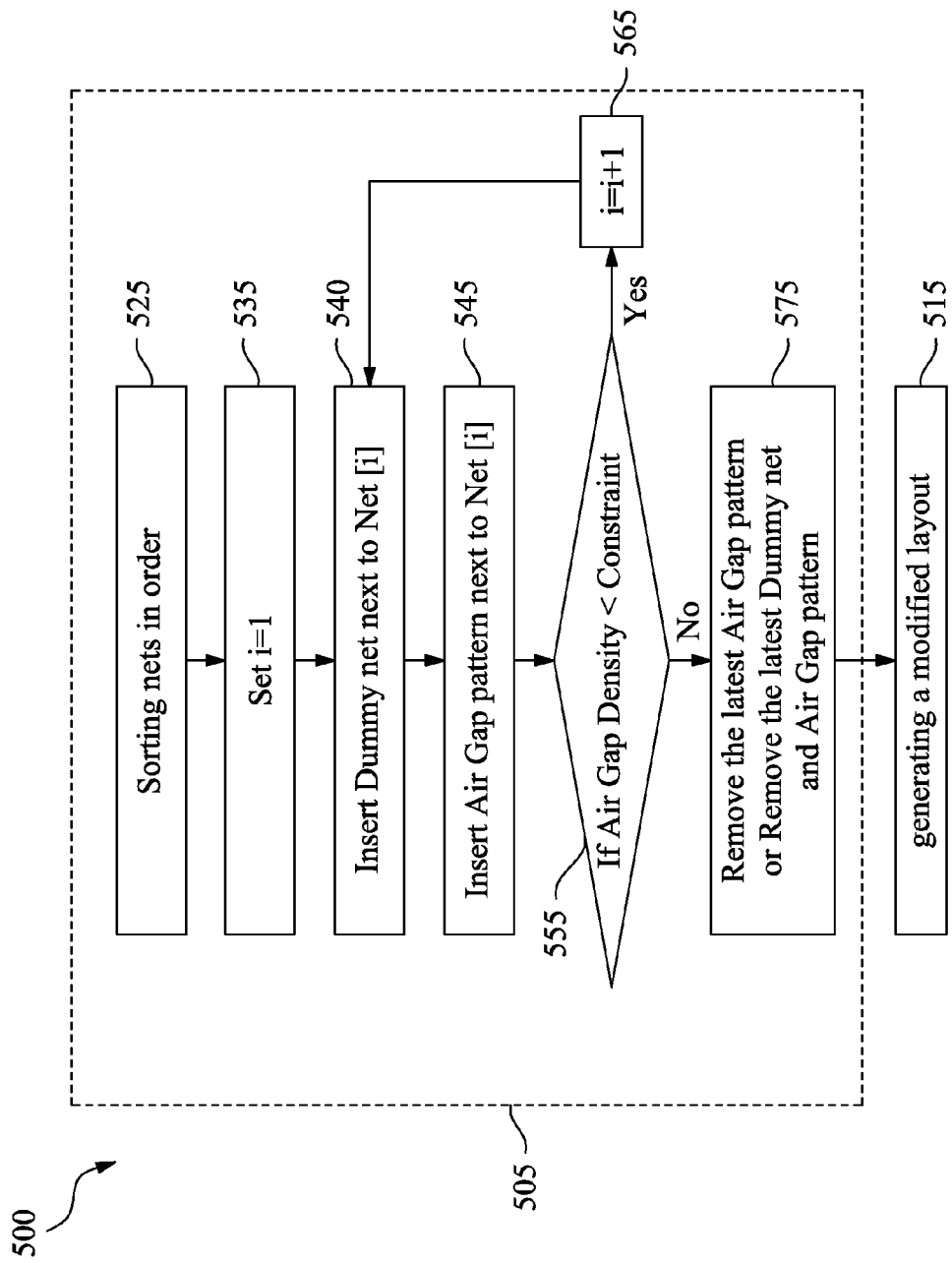
FIG. 5 is a flow chart of a dummy net and air gap insertion method, in accordance with some embodiments.

FIG. 5 is a flow chart of a dummy net and air gap insertion method 500, in accordance with some embodiments. FIGS. 6A-6B are schematic, plan views of various portions of IC layouts 600A-600B for illustrating various implementations of the method 500, in accordance with some embodiments. The method 500 comprises a dummy net and air gap insertion process 505 in which dummy nets and air gap patterns are inserted adjacent to a plurality of nets of a layout of an IC. The method 500 further comprises operation 515 in which a modified layout comprising the plurality of nets and the inserted dummy nets and air gap patterns is generated.

At operation 525 of the dummy net and air gap insertion process 505 in FIG. 5, the plurality of nets in the layout, or a portion of the layout, of the integrated circuit is sorted in an order. In some embodiments, the plurality of nets is sorted by corresponding lengths of the nets, as described with respect to FIG. 4A. For example, as illustrated in FIG. 6A, a layer of the layout 600A comprises nets 602, 604, 606. The net 604 has the longest length (which is indicated as "Length" in FIG. 6A) compared to the nets 602, 606.

After sorting the plurality of nets, dummy nets and air gap patterns are inserted, in accordance with the sorted order of the plurality of nets, adjacent to the plurality of nets. For example, at operation 535 of the dummy net and air gap insertion process 505 in FIG. 5, an index i is set to 1. This corresponds to selecting the first net among the sorted nets of the IC for dummy net and air gap insertion. In the example configuration in FIG. 6A, the net 604 with the longest length is selected for dummy net and air gap insertion before the other nets 602, 606 with shorter lengths.

At operation 540 of the dummy net and air gap insertion process 505 in FIG. 5, at least one dummy net is inserted adjacent to the currently selected net, i.e., Net[i]. In the example configuration in FIG. 6A, dummy nets 208, 610 are inserted adjacent to the currently selected net 604, at a spacing s that permits air gap patterns to be inserted between the dummy nets 608, 610 and the currently selected net 604.

At operation 545 of the dummy net and air gap insertion process 505 in FIG. 5, at least one air gap pattern is inserted adjacent to the currently selected net, i.e., Net[i]. In the example configuration in FIG. 6A, air gap patterns 611, 613, 615 and 617 are inserted adjacent to the currently selected net 604. Specifically, the air gap patterns 611, 613, 615 and 617 are inserted between the currently selected net 604 on one hand, and corresponding nets 602, 606, 608 and 610 on the other hand, to reduce parasitic capacitances between the corresponding adjacent nets.

At operation 555 of the dummy net and air gap insertion process 505 in FIG. 5, it is determined whether the air gap patterns that have been inserted satisfy a constraint, as described with respect to operation 355 in FIG. 3.

At operation 565 of the dummy net and air gap insertion process 505 in FIG. 5, in response to a determination that the air gap patterns that have been inserted satisfy the constraint (Yes at operation 555), the index i is incremented, and the process returns to operations 540 and 545 to insert at least one dummy net and at least one air gap pattern for the next net among the sorted nets of the IC, as described with respect to operation 365 in FIG. 3.

At operation 575 of the dummy net and air gap insertion process 505 in FIG. 5, in response to a determination that the air gap patterns that have been inserted do not satisfy the constraint (No at operation 555), the last inserted air gap pattern is removed, and then the process proceeds to operation 515, as described with respect to operation 375 in FIG. 3.

In some embodiments, at operation 575, in response to a determination that the air gap patterns that have been inserted do not satisfy the constraint, not only the last inserted air gap pattern is removed, but also the last inserted dummy net is removed. In some embodiments, in response to a determination that the constraint is not satisfied when several air gap patterns and/or dummy nets have been inserted adjacent to the current net, all of the air gap patterns and dummy nets inserted adjacent to the current net are removed. In some embodiments, in response to a determination that the constraint is not satisfied when several air gap patterns and dummy nets have been inserted adjacent to the current net, the air gap patterns inserted adjacent to the current net are removed one-by-one until the constraint is satisfied. When an air gap pattern inserted between the current net and an inserted dummy net is removed, the dummy net is also removed. Other arrangements are within the scope of various embodiments.

One or more advantages and/or effects described with respect to the method 300 is/are achievable by the method 500, in accordance with some embodiments. In at least one embodiment, the additional insertion of dummy nets increases the air gap coverage. For example, in the layout 400A in FIG. 4A, two air gap patterns 411, 413 are inserted, whereas in the layout 600A in FIG. 6A, four air gap patterns 611, 613, 615, 617 are inserted. As a result, in at least one embodiment, the parasitic capacitance reduction effect is further enhanced by the method 500.

In some embodiments, the nets in an IC, or a portion of the IC, are sorted by a cost function. An example cost function Cost3 is determined by the following equation:

$$Cost3(i) = Cap\_Cost(i) = \sum_{j=1}^{N} Proj\_Length(j) \times Cair\_gap + \sum_{k=1}^{P} Dummy\_Length(k) \times Cdummy \quad (3)$$

where
i indicates an i-th net among the plurality of nets,
N is a number of nets among the plurality of nets and adjacent the i-th net,
j indicates a j-th net among the N nets adjacent the i-th net,
Proj_Length(j) is a projection length over which the i-th net and the j-th net extend along each other,
Cair_gap is a unit coupling capacitance between i-th net and the j-th net,
P is a number of dummy nets insertable adjacent the i-th net,
k indicates a k-th dummy net among the P dummy nets insertable adjacent the i-th net,
Dummy_Length(k) is a length of the k-th dummy net, and
Cdummy is a unit coupling capacitance of the k-th dummy net.

In the example configuration in FIG. 6B, the layout 600B comprises nets 622, 624, 626 and 632. The projection lengths of the net 624 with respect to the adjacent nets 622 and 626 are determined as described with respect to FIG. 4B. Based on the dimensions and/or projection lengths of the nets 622, 624, 626 and 632, it is determined that dummy nets 628, 630 are insertable adjacent to the net 624, and the dimensions of the dummy nets 628, 630 are determined. Based on the dimensions of the insertable dummy nets 628, 630, the cost function Cost3 (or Cap_Cost) associated with capacitances of the dummy nets inserted adjacent the net 624 is determined. The cost functions Cost3 associated with capacitances of the dummy nets inserted adjacent the other nets 622, 626 and 632 are determined in a similar manner, and the nets 622, 624, 626 and 632 are sorted by the cost function Cost3. The process subsequently inserts dummy nets and air gap patterns as described with respect to FIG. 5. In one or more embodiments implementing the sorting arrangement using the cost function Cost3, the parasitic capacitance reduction is optimized for total capacitances of nets.

Another example cost function Cost4 is determined by the following equation:

$$Cost4(i) = Cap\_Cost(i)/Length(i) \quad (4)$$

where
i indicates an i-th net among the plurality of nets, and
Length(i) is a length of the i-th net.

After calculating the cost function Cost4 for the nets, the nets are sorted by the calculated cost function values. The process subsequently inserts dummy nets and air gap patterns as described with respect to FIG. 5. In one or more embodiments implementing the sorting arrangement using the cost function Cost4, the parasitic capacitance reduction is optimized for a ratio of total capacitances of nets to net lengths.

Another example cost function Cost5 is determined by the following equation:

$$Cost5(i) = Cap\_Cost(i) \times Res\_Cost(i) \quad (5)$$

where $$Res\_Cost(i) = \sum_{k=1}^{P} Dummy\_Length(k) \times Rdummy, \text{ and}$$

Rdummy is a unit resistance of the k-th dummy net.

After calculating the cost function Cost5 for the nets, the nets are sorted by the calculated cost function values. The process subsequently inserts dummy nets and air gap patterns as described with respect to FIG. 5. In one or more embodiments implementing the sorting arrangement using the cost function Cost5, not only the cost function Cap_Cost associated with capacitances of the inserted dummy nets, but also the cost function Res_Cost associated with resistances of the inserted dummy nets are considered. In at least one embodiment, this additional consideration of the resistances of the inserted dummy nets is useful, because the inserted dummy nets, while contribute to a reduction of capacitance, at the same time increase resistances due to the added conductive patterns corresponding to the dummy nets.

The described sorting arrangements for dummy net and air gap insertion are examples. Other sorting arrangements are within the scope of various embodiments. In some embodiments, different sorting arrangements are applied to different portions of an IC. In some embodiments, when a sorting arrangement results in air gap patterns that do not pass a verification or check at a later stage, another sorting arrangement is applied to re-generate the air gap patterns.

FIG. 6C is a schematic, plan view of a portion of an IC layout 600C, in accordance with some embodiments. The layout 600C comprises nets 652, 654, 656, 658, 660 and 662. The adjacent nets 654, 656 are spaced from each other by a spacing s that permits an air gap pattern 675 to be inserted between the nets 654, 656. Similarly, the spacing s between the adjacent nets 658 and 660, and between the adjacent nets 660 and 662, permits insertion of corresponding air gap patterns 677, 679. However, the spacing between the nets 652 and 654 is 3s which is greater than a spacing s permitted for air gap insertion. In some embodiments, a dummy net is inserted between two adjacent nets having a spacing greater than the maximum spacing for air gap insertion, to permit air gap patterns to be inserted between the dummy net and the two adjacent nets. For example, a dummy net 664 having a width of s is inserted between the nets 652 and 654. As a result, the spacing between the dummy net 664 and each of the nets 652, 654 becomes the spacing s permitted for air gap insertion. As a result, air gap patterns 671, 673 are insertable between the dummy net 664 and the corresponding nets 652, 654 to increase the air gap coverage and reduce parasitic capacitances of the nets 652, 654. The described dummy net insertion technique is referred to herein as 3s dummy insertion. In some embodiments, a 3s dummy insertion is performed at operation 130 described with respect to FIG. 1. In some embodiments, the 3s dummy insertion performed at operation 130 is further followed by an air gap insertion method described with respect to FIG. 3. In some embodiments, a 3s dummy insertion is performed at operation 540 in a dummy net and air gap insertion method as described with respect to FIG. 5. Other arrangements are within the scope of various embodiments.

The layout 600C shows an example when a 3s dummy insertion is performed in accordance with some embodiments to increase the air gap coverage; however, the dummy net and air gap insertion are not optimized. FIG. 6D is a schematic, plan view of a portion of an IC layout 600D with an optimized dummy net and air gap insertion, in accordance with some embodiments. In at least one embodiment, the layout 600D is obtained by performing the method 500 using a sorting arrangement described with respect to FIGS. 6A-6B and cost functions Cost3, Cost4 and Cost5. For example, the sorting arrangement by net length as described with respect to FIG. 6A is employed in at least one embodiment to obtain the layout 600D. Compared to the layout 600C, in the layout 600D, a dummy net 684 is inserted between the net 654 and 658, and air gap patterns 691, 693, 695, 677 and 699 are concentrated around the long nets 658, 660 and the inserted dummy net 684. As a result, parasitic capacitances of the long nets 658 and 660 are reduced, resulting in a greater amount of parasitic capacitance reduction than that achieved with the layout 600C. In at least one embodiment, the lengths of the dummy net 664 and air gap patterns 671, 673, 675, and 679 in the layout 600C are substantially equal to the lengths of the corresponding dummy net 684 and air gap patterns 691, 693, 695, and 699 in the layout 600C. As a result, compared to the layout 600C, the layout 600D achieves a greater amount of parasitic capacitance reduction along long and/or critical nets, with substantially no change in the coverage of dummy nets and air gap patterns.

Figure 7:
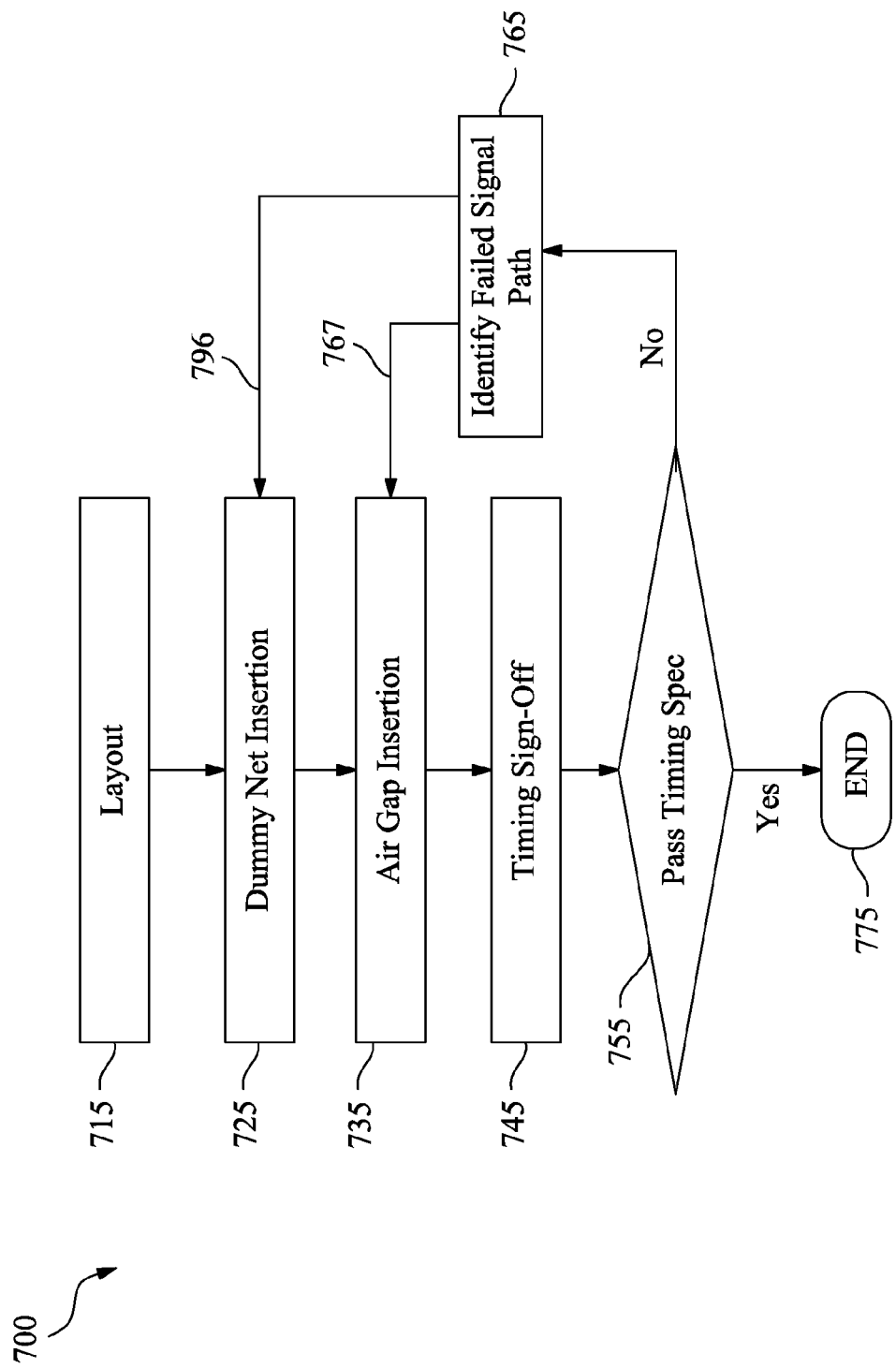
FIG. 7 is a flow chart of a portion of an IC design process, in accordance with some embodiments.

FIG. 7 is a flow chart of a portion of an IC design process 700, in accordance with some embodiments.

At operation 715, a layout of an IC is generated. In at least one embodiment, the layout is generated by an APR tool described herein.

At operation 725, a dummy net insertion process is performed. In at least one embodiment, dummy nets are inserted to improve production yield and/or quality as described with respect to operation 130 in FIG. 1. In at least one embodiment, a 3s dummy insertion is performed in the dummy net insertion process at operation 725.

At operation 735, an air gap insertion process is performed. In at least one embodiment, the air gap insertion method 300 is performed at operation 735. In some embodiments, the dummy net and air gap insertion method 500 is performed at operations 725 and 735. A modified layout of the IC is generated by operation 735

At operation 745, a timing sign-off check is performed. In at least one embodiment, a timing sign-off check is performed to determine whether the modified layout of the IC satisfies a timing specification, as described with respect to operation 160 in FIG. 1.

In response to a determination that the modified layout of the IC does not satisfy the timing specification (No at operation 755), the process proceeds to operation 765 at which the failed signal path or signal paths in the IC is/are identified.

In some embodiments, the process further proceeds (as indicated by arrow 767) from operation 765 to operation 735 at which an air gap insertion optimization is performed for nets in the failed signal path or signal paths. For example, in one or more embodiments, the air gap insertion method 300 is performed at operation 735 for nets in the layout of the IC, using at least one of the sorting arrangements described with respect to FIGS. 4A-4D, e.g., net length, projection length, Cost1 or Cost2. The air gap insertion method 300 is applied again for nets in the failed signal path or signal paths identified at operation 765 using at least one of the described sorting arrangements, e.g., net length, projection length, Cost1 or Cost2. In at least one embodiment, the air gap insertion method 300 uses different sorting arrangements for different runs. For example, the air gap insertion method 300 uses one sorting arrangement, e.g., net length, for optimizing air gap insertion of the layout, and uses a different sorting arrangement, e.g., Cost 2, for optimizing air gap insertion of the failed signal path or signal paths. Other arrangements are within the scope of various embodiments.

In some embodiments, the process further proceeds (as indicated by arrow 769) from operation 765 to operation 725 at which a dummy net and air gap insertion optimization is performed for nets in the failed signal path or signal paths. For example, in one or more embodiments, the dummy net and air gap insertion method 500 is performed at operations 725, 735 for nets in the layout of the IC, using at least one of the sorting arrangements described herein, e.g., net length, Cost3, Cost4 and Cost5. The dummy net and air gap insertion method 500 is applied again for nets in the failed signal path or signal paths identified at operation 765 using at least one of the described sorting arrangements, e.g., net length, Cost 3, Cost4 or Cost5. In at least one embodiment, the air gap insertion method 300 uses different sorting arrangements for different runs. For example, the dummy net and air gap insertion method 500 uses one sorting arrangement, e.g., net length, for optimizing dummy net and air gap insertion of the layout, and uses a different sorting arrangement, e.g., Cost5, for optimizing dummy net and air gap insertion of the failed signal path or signal paths. Other arrangements are within the scope of various embodiments.

In response to a determination that the modified layout of the IC satisfies the timing specification (Yes at operation 755), the process ends at operation 775. In at least one embodiment, the modified layout that has passed the timing sign-off is subject to further verifications or checks, or is outputted for manufacturing the IC.

In other approaches, an air gap insertion is performed for yield consideration only, and when there is a timing violation, the process retunes to the placement or routing stage at the APR for re-placement and/or re-routing which is time consuming. Compared to the other approaches, the IC design process 700 in accordance with some embodiments does not return to the placement or routing stage when there is a timing violation; rather, the IC design process 700 returns to the dummy net insertion and/or air gap insertion stages for optimizing the dummy net and/or air gap arrangements as described herein. Because the IC design process 700 in accordance with some embodiments does not involve re-placement and/or re-routing of the layout when one or more signal paths failed the timing sign-off, the IC design process 700 in one or more embodiments reduces the cycle time compared to the other approaches. In some embodiments, the IC design process 700 is applicable in both digital and analog design timing closure procedures, for fixing failed signal paths with reduced time cycle. One or more advantages and/or effects described with respect to the method 300 and/or method 500 is/are achievable by the method 700, in accordance with some embodiments.

Figure 8:
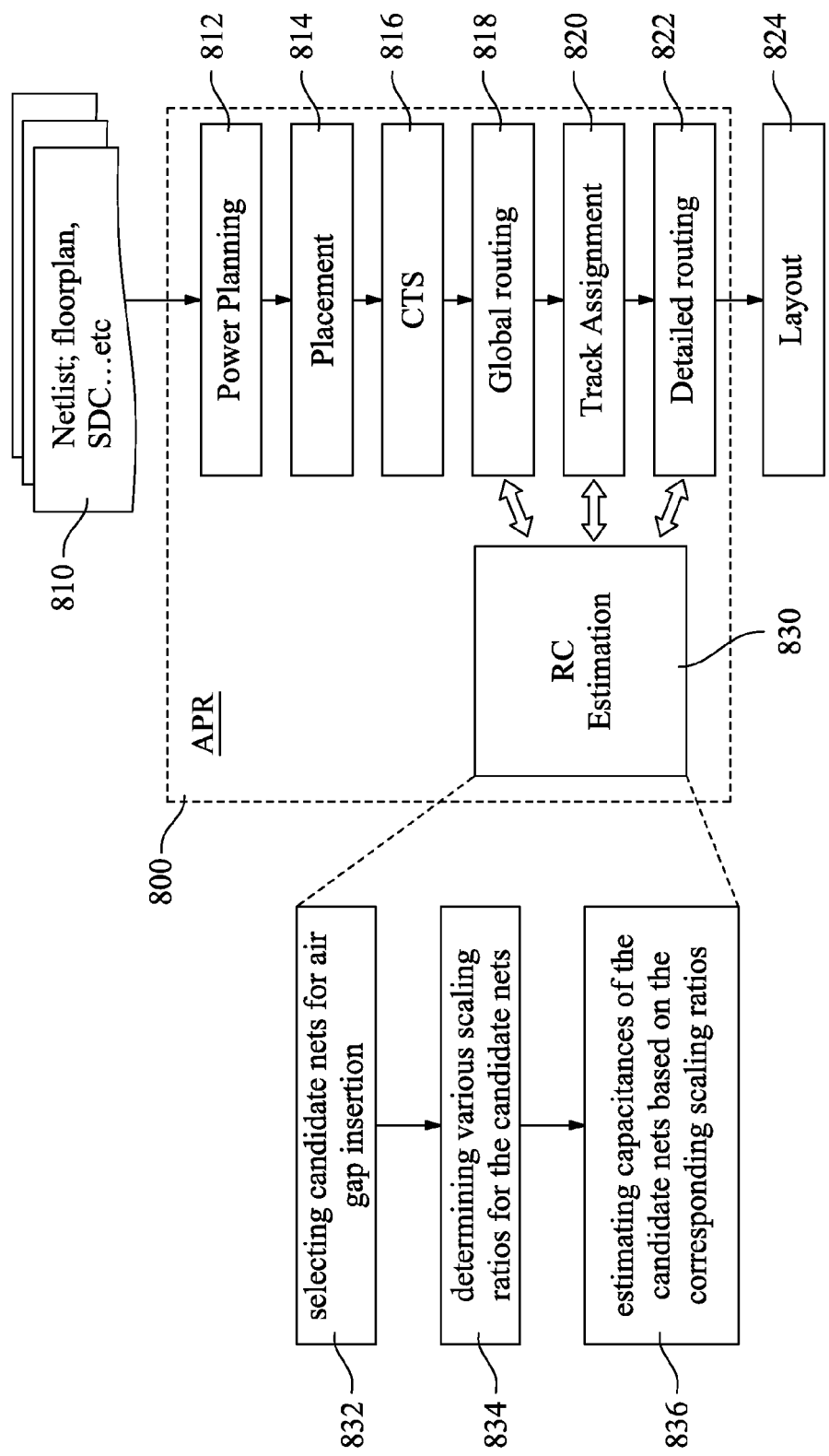
FIG. 8 is a functional flow chart of an EDA tool, in accordance with some embodiments.

FIG. 8 is a functional flow chart of an APR tool 800, in accordance with some embodiments. In at least one embodiment, the APR tool 800 corresponds to the APR tool described at operation 120 of FIG. 1 and/or the APR tool described at operation 715 of FIG. 7.

At operation 810, the APR tool 800 receives inputs for generation of a layout of an IC. In the example configuration in FIG. 8, the inputs include a design of the IC in the form of a netlist as described with respect to operation 110, a Synopsys Design Constraint (SDC) File that contains constraints on the design, and a floor plan. Other arrangements are within the scope of various embodiments. For example, in some embodiments, the APR tool 800 performs floor planning to identify circuit elements, which are to be electrically connected to each other and which are to be placed in close proximity to each other, for reducing the area of the IC and/or reducing time delays of signals travelling over the interconnections or nets connecting the electrically connected circuit elements. In some embodiments, the APR tool 800 performs partitioning to divide the design into a plurality of blocks or groups, such as clock and logic groups.

At operation 812, the APR tool 800 performs power planning based on the partitioning and/or the floor planning of the electronic design in some embodiments.

At operation 814, the APR tool 800 performs placement. For example, placement is performed in one or more phases including, but not limited to, pre-placement optimization, in-placement optimization, and post-placement optimization before and/or after clock tree synthesis (CTS).

At operation 816, the APR tool 800 performs CTS to minimize skew and/or delays.

At operations 818, 820 and 822, the APR tool 800 performs routing to route various nets interconnecting the placed circuit elements. The routing is performed to ensure that the routed interconnections or nets satisfy a set of constraints.

Specifically, at operation 818, the APR tool 800 performs global routing to allocate routing resources used for interconnections or nets. For example, during global routing, the routing area is divided into a number of sub-areas, pins of the placed circuit elements are mapped to the sub-areas, and nets are constructed as sets of sub-areas in which interconnections are physically routable.

At operation 820, the APR tool 800 performs track assignment to assign interconnections or nets to corresponding conductive layers of the IC.

At operation 822, the APR tool 800 performs detailed routing to route interconnections or nets in the assigned conductive layers and within the global routing resources. For example, during the detailed routing, detailed, physical interconnections are generated within the corresponding sets of sub-areas defined at the global routing and in the conductive layers defined at the track assignment.

At operation 824, the APR tool 800 outputs a layout of the IC including the placed circuit elements and routed nets. The described operations of the APR tool 800 are examples. Other arrangements are within the scope of various embodiments. For example, in one or more embodiments, one or more of the described operations are omitted.

In some embodiments, during the routing operation, the APR tool 800 is configured to attempt minimize net lengths of routed nets, and/or minimize the overall area of the IC. In some situations, the routing operation tends to increase a density of conductive patterns and/or projection lengths along which nets run alongside each other. To reduce parasitic capacitances and/or signal cross-talk associated with the increased density of conductive patterns, the APR tool 800 in some embodiments is further configured to perform an RC estimation, at operation 830, to estimate parasitic parameters, especially parasitic capacitances, of interconnections, as such interconnections are being routed. The estimated parasitic parameters are used in at least one operation of the routing process, i.e., in at least one of global routing, track assignment or detailed routing, to estimate timing delays for various options for routing a net. The timing delay estimation is then used to determine which routing option is to be used to route the net so that a predetermined performance target is met.

In some embodiments, the APR tool 800 performs the RC estimation with consideration of air gaps to be inserted later into the layout outputted by the APR tool 800, as described herein. The RC estimation comprises operations 832, 834 and 836 which are described with respect to FIGS. 9A-9E.

At operation 832, among a plurality of nets of the IC, candidate nets for air gap insertion are selected. For example, FIG. 9A is a schematic, plan view of a portion 900A of a layout being generated for an IC, in accordance with some embodiments. The layout portion 900A comprises nets 902, 904, 906, 908 and 910 arranged on a routing grid with grid lines 912. The adjacent grid lines 912 are spaced from each other by a pitch corresponding to an integer multiple of the spacing s which is a minimum spacing between adjacent nets permitted by a design and/or manufacture specification of the IC. In the example configuration in FIG. 9A, the pitch between the adjacent grid lines 912 is 2s. The net 904 is spaced from the nets 902, 906 by the spacing s which is not greater than a maximum spacing for air gap insertion. As a result, air gap patterns 913, 915 are insertable between the net 904 and the corresponding nets 902, 906, and the nets 902, 904, 906 are identified as candidate nets for air gap insertion. In at least one embodiment, the air gap patterns 913, 915 are not actually inserted until after the layout is outputted by the APR tool 800 and air gap insertion process is performed as described with respect to FIGS. 3 and 5. The nets 908, 910 are spaced from each other by a spacing 3s which is greater than the maximum spacing for air gap insertion. As a result, no air gap patterns are insertable between the nets 908, 910, and nets 908, 910 are not identified as candidate nets for air gap insertion. In some embodiments, the spacing s is the maximum spacing for air gap insertion, i.e., air gap patterns are insertable only between adjacent nets which are spaced form each other by the spacing s. In at least one embodiment, spacing s is 0.08 μm. Based on the grid lines 912 along which the nets are arranged or planned to be arranged, spacings between adjacent nets are determined and compared with the maximum spacing for air gap insertion, and candidate nets for air gap insertion are determined based on the comparison. Other arrangements for identifying candidate nets for air gap insertion are within the scope of various embodiments.

At operation 834, various scaling ratios for the candidate nets are determined based on lengths of the corresponding candidate nets and, at operation 836, capacitances of the candidate nets are estimated based on the corresponding scaling ratios. The scaling ratios indicate influences of air gaps on capacitances of the corresponding candidate nets. In some embodiments, the higher the scaling ratio, the lower the influences of air gaps on a capacitance of the corresponding candidate net. For example, FIG. 9B is graph 900B for determining various scaling ratios in accordance with some embodiments. The graph 900B is described with respect to FIGS. 9C-9E which are schematic, plan views of various portions 900C-900E of the layout being generated, in accordance with some embodiments.

In some embodiments, when a candidate net has a length less than a first threshold length, the scaling ratio of the candidate net has a first scaling ratio value. For example, as illustrated in FIG. 9B, when a candidate net has a length less than a first threshold length L1, the scaling ratio of the candidate net has a first scaling ratio value SR1. In at least one embodiment, the first scaling ratio value SR1 is 1 which indicates that no air gaps are to be inserted adjacent to the candidate net, and that the capacitance of the candidate net is not influenced by air gaps. In at least one embodiment, the first threshold length L1 is the minimal net length for which an air gap is insertable. In at least one embodiment, L1 is 0.18754 µm. In the example configuration in FIG. 9C, a net 922 is a candidate net for air gap insertion, because it is at the spacing s from an adjacent net 924. However, the length L of the net 922 is shorter than L1, and as a result, no air gap pattern is insertable adjacent to the net 922.

In some embodiments, when a candidate net has a length not less than the first threshold length and not greater than a second threshold length, the scaling ratio of the candidate net decreases from the first scaling ratio value to a second scaling ratio value as the corresponding length of the candidate net increases from the first threshold length to the second threshold length. For example, as illustrated in FIG. 9B, when a candidate net has a length between the first threshold length L1 and a second threshold length L2, the scaling ratio of the candidate net decreases from the first scaling ratio value SR1 to a second scaling ratio value SR2 as the corresponding length of the candidate net increases. In at least one embodiment, the second scaling ratio value SR2 is 0.7 which indicates that when air gaps are inserted adjacent to the corresponding candidate net, the capacitance of the candidate net will be reduced by 30%, i.e., will be 70% of the capacitance of the corresponding candidate net without air gap insertion. In at least one embodiment, the second threshold length L2 is 6 µm. The specific numeric values of SR1, SR2, L1 and L2 are examples. Other numeric values are within the scope of various embodiments.

In the example configuration in FIG. 9D, candidate nets 932, 934, 936 are sufficiently long for air gap patterns 937, 939 to be insertable between the candidate nets 932, 934, and the nets 934, 936. However, a presence of vias 941, 943 for electrically coupling the candidate net 934 to other conductive patterns limits the effective length Lf of the insertable air gap patterns 937, 939 to a part of the length L of the candidate nets 932, 934, 936. A reason is that air gaps are not to be formed in regions 945, 947 surrounding the corresponding vias 941, 943, to reduce a possibility that the vias 941, 943 land on an air gap, e.g., due to misalignment in manufacture. A size of the regions 945, 947 is determined by a via constraint which is a spacing V between facing edges of the regions 945, 947 and the corresponding vias 941, 943. In at least one embodiment, V is 0.06 µm. Other numeric values of V are within the scope of various embodiments.

The decreasing scaling ratio for net lengths between L1 and L2 in FIG. 9B reflects the influence of the via constraint on air gap insertion. When the net length is short as shown in the example configuration of FIG. 9D, the via constraint significantly limits the effective length Lf of the insertable air gaps. As a result, the amount of capacitance reduction achievable with air gap insertion is low, and the capacitance of the candidate net with air gap insertion is close to the capacitance of the candidate net without air gap insertion, which means the scaling ratio is close to 1. When the net length increases as shown in the example configuration of FIG. 9E, the via constraint limits the effective length Lf of the insertable air gaps to a lesser extent compared to the length L of the candidate net. As a result, the amount of capacitance reduction achievable with air gap insertion increases, and the capacitance of the candidate net with air gap insertion is reduced, which means the scaling ratio is decreased. When the net length is sufficiently long for the via constraint to be ignorable in at least one embodiment, the scaling ratio is fixed. For example, as illustrated in FIG. 9B, when a candidate net has a length greater than the second threshold length L2, the corresponding scaling ratio has the second scaling ratio value SR2.

The described relationship between the net length and the scaling ratio is an example. Other arrangements are within the scope of various embodiments. For example, in at least one embodiment, the decrease of the scaling ratio for net lengths between L1 and L2 is not linear as illustrated in FIG. 9B; instead the decrease of the scaling ratio is non-linear or step-wise in some embodiments.

Based on the determined scaling ratios, capacitances of the candidate nets with air gap insertion are estimated by multiplying the corresponding scaling ratios with the capacitances of the candidate nets without air gap insertion. The estimated capacitances with air gap consideration are used in the routing operation as described herein. Compared to other approaches where air gaps are not considered during the routing stage, the APR tool in one or more embodiments provides a layout optimized for subsequent air gap insertion. As a result, at least one embodiment maximizes, or at least increases, performance benefit associated with air gap insertion.

Besides the air gap consideration at an APR tool as described with respect to FIG. 8 and/or the addition of dummy nets for increasing air gap coverage as described with respect to FIGS. 5 and 6A-6D, some embodiments consider air gaps at a later design stage, for example, in an RC extraction operation.

Figure 10:
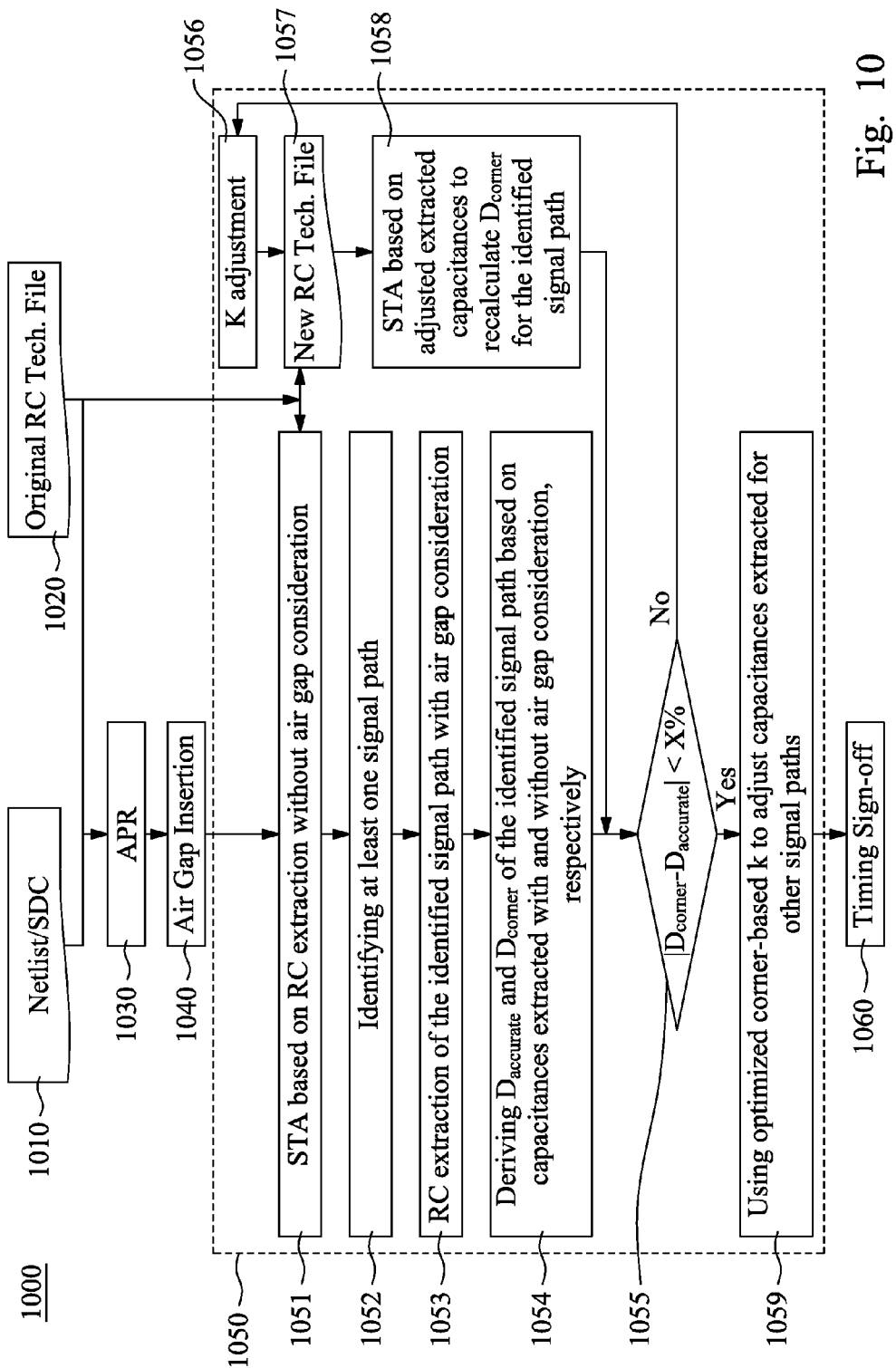
FIG. 10 is a functional flow chart of at least a portion of an IC design process, in accordance with some embodiments.

FIG. 10 is a functional flow chart of at least a portion of an IC design process 1000, in accordance with some embodiments.

At operation 1010, a netlist of an IC and a SDC file are provided. In at least one embodiment, the netlist and SDC file correspond to inputs for generation of a layout, as described with respect to operation 810 in FIG. 8.

At operation 1020, an original RC technology file is provided. Example methods for generating the original RC technology file are described in U.S. Patent Application Publication No. 2009/0077507, which is incorporated by reference herein in its entirety. In at least one embodiment, the original RC technology file comprises pre-stored parasitic capacitances and resistances of various primitive polygon patterns. In at least one embodiment, the original RC technology file further comprises a dielectric constant K for determining the parasitic capacitances. When air gaps are inserted into the IC, parasitic capacitances are reduced. In at least one embodiment, the dielectric constant K is adjusted to mimic the parasitic capacitance reduction due to air gap insertion, as described herein. For example, the dielectric constant K is reduced to be smaller than the actual dielectric constant of the dielectric material which is used for manufacturing the IC and over which the parasitic capacitances occur.

At operation 1030, the netlist and SDC file provided at operation 1010 and the original RC technology file provided at operation 1020 are used as inputs to an APR tool which performs a placement and routing operation to generate a layout of the IC, as described with respect to operation 120 in FIG. 1. In at least one embodiment, the APR tool 800 described herein is used for the placement and routing operation 1030.

At operation 1040, an air gap insertion process is performed to insert air gaps into the layout outputted by the APR tool to obtain a modified layout. In at least one embodiment, the air gap insertion method 300 or the dummy net and air gap insertion method 500 is performed at operation 1040.

At operation 1050, the modified layout outputted by the air gap insertion process at operation 1040 is subjected to an RC extraction by an RC extraction tool. The RC extraction is performed to determine parasitic parameters in the modified layout for subsequent processing, as described with respect to operation 150 in FIG. 1. In at least one embodiment, the RC extraction at operation 1050 comprises operations 1051-1059.

At operation 1051, a static timing analysis (STA) is performed based on RC extraction without air gap consideration. In at least one embodiment, the RC extraction without air gap consideration extracts parasitic resistances and capacitances from the modified layout, while ignoring the inserted air gaps. For example, the RC extraction tool divides the modified layout received from operation 1040 into blocks containing recognizable primitive polygon patterns defined in the original RC technology file provided at operation 1020. The RC extraction tool then extracts parasitic resistances and capacitances of the modified layout by reading the corresponding pre-stored parasitic resistances and capacitances from the original RC technology file. The STA is performed using the extracted parasitic resistances and capacitances to evaluate time delays along various signal paths in the IC. In at least one embodiment, by ignoring the inserted air gaps and the complexity associated with variations of dielectric constant along nets with inserted air gaps, operation 1051 is performed without having to run a time-consuming RC extraction with air gap consideration for the modified layout.

At operation 1052, based on the time delays along various signal paths obtained from operation 1051, at least one of the signal paths is identified for RC extraction with air gap consideration. In at least one embodiment, the identified signal path is a critical signal path. In an example, the critical signal path is a signal path having the longest time delay. In another example, the critical signal path is a signal path having a time delay close to or higher than a timing constraint. In some embodiments, more than one critical signal paths are identified. For example, several top critical signal paths are identified for RC extraction with air gap consideration. Other arrangements for identifying a signal path for RC extraction with air gap consideration are within the scope of various embodiments.

At operation 1053, an RC extraction with air gap consideration is performed for the signal path identified at operation 1052. This RC extraction with air gap consideration is referred to herein as corner-based RC extraction. In at least one embodiment, the corner-based RC extraction is performed in a manner similar to the RC extraction described with respect to operation 1051, with an exception that the varying dielectric constants along nets with inserted air gaps are taken into consideration. As a result, the corner-based RC extraction provides more accurate extracted parasitic parameters. In at least one embodiment, by performing the corner-based RC extraction for one or more identified signal paths, but not for other signal paths in the IC, processing time is reduced while accuracy is assured across the IC, because the corner cases corresponding to the critical signal paths are covered by the corner-based RC extraction.

At operation 1054, for each of the identified signal paths, two time delay values are obtained. A first time delay value, referred to herein as $D_{accurate}$, is derived for the identified signal path using the parasitic capacitances extracted by the corner-based RC extraction. A second time delay value, referred to herein as $D_{corner}$, is derived for the identified signal path using the parasitic capacitances extracted by the RC extraction without air gap consideration as described with respect to operation 1051. In at least one embodiment, $D_{corner}$ is obtained from the results of the STA at operation 1051.

At operation 1055, it is determined whether $D_{corner}$ matches $D_{accurate}$. $D_{corner}$ is considered to match $D_{accurate}$ when the absolute value of a difference between $D_{accurate}$ and $D_{corner}$ is not greater than X percent. In some embodiments, X is from 2% to 4%. In at least one embodiment X is 3%. Other X values and/or arrangements for matching $D_{corner}$ with $D_{accurate}$ are within the scope of various embodiments.

At operation 1056, in response to a determination (No at operation 1055) that $D_{corner}$ does not match $D_{accurate}$, the dielectric constant K in the original RC technology file is adjusted. In at least one embodiment, $D_{corner} > D_{accurate}$ indicates that the parasitic capacitances extracted without air gap consideration are larger than the more accurate parasitic capacitances extracted by the corner-based RC extraction. To reduce the parasitic capacitances extracted without air gap consideration to match those extracted by the corner-based RC extraction, the dielectric constant K in the original RC technology file is reduced, e.g., scaled down. In at least one embodiment, $D_{corner} < D_{accurate}$ indicates that the parasitic capacitances extracted without air gap consideration are smaller than the more accurate parasitic capacitances extracted by the corner-based RC extraction. To increase the parasitic capacitances extracted without air gap consideration to match those extracted by the corner-based RC extraction, the dielectric constant K in the original RC technology file is increased e.g., scaled up. In some embodiments, the signal path identified for corner-based RC extraction and adjustment of dielectric constant K comprises a 1W1S signal path with nets which have a minimal width (i.e., 1W) permitted by the specification of the IC, and a minimal spacing (i.e., 1S) permitted by the specification of the IC from an adjacent net.

At operation 1057, a new RC technology file is obtained by updating the original RC technology file with the dielectric constant K adjusted at operation 1056.

At operation 1058, the parasitic capacitances extracted without air gap consideration are updated with the adjusted dielectric constant K. For example, when the dielectric constant K is scaled down in the adjustment at operation 1056, the parasitic capacitances are also scaled down in accordance with the adjusted dielectric constant K. When the dielectric constant K is scaled up in the adjustment at operation 1056, the parasitic capacitances are also scaled up in accordance with the adjusted dielectric constant K. The STA is performed to recalculate $D_{corner}$ for the corresponding identified signal path using the updated parasitic capacitances. The process then returns to operation 1055 to determine whether the recalculated $D_{corner}$ matches $D_{accurate}$. When the recalculated $D_{corner}$ still does not match $D_{accurate}$, the dielectric constant K is iteratively adjusted in operations 11056, 1057 and 1058.

At operation 1059, in response to a determination (Yes at operation 1055) that $D_{corner}$ matches $D_{accurate}$, the dielectric constant K corresponding to the matching of $D_{accurate}$ and $D_{corner}$ is used to adjust parasitic capacitances extracted, without air gap consideration, for other signal paths in the IC. In some embodiments, when the dielectric constant K is scaled down in the adjustment at operation 1056, the parasitic capacitances extracted for the other signal paths are also scaled down in accordance with the adjusted dielectric constant K. When the dielectric constant K is scaled up in the adjustment at operation 1056, the parasitic capacitances extracted for the other signal paths are also scaled up in accordance with the adjusted dielectric constant K. The adjusted parasitic parameters are outputted for subsequent processing.

At operation 1060, the adjusted parasitic parameters are used for timing signing-off the IC layout. In at least one embodiment, the timing sign-off at operation 1060 corresponds to the timing sign-off described with respect to operation 160 in FIG. 1.

Some other approaches perform the RC extraction with air gap consideration for the IC. Such an RC extraction is time-consuming due to the presence of the inserted air gaps and the associated variations of the dielectric constant when the isolation between adjacent conductive patterns changes from air gap to dielectric material. In addition, when the locations of air gap insertion change based on an analysis at a later stage, the mask layer containing the air gap patterns is re-generated and the time-consuming RC extraction with air gap consideration is repeated for the IC. As a result, the design time and cost increase.

Compared to other approaches, the IC design process 1000 in accordance with some embodiments performs the RC extraction with air gap consideration for one or more critical signal paths, but not for other paths in the IC. As a result, processing time is reduced while accuracy is assured across the IC, because the corner cases corresponding to the critical signal paths are covered by the corner-based RC extraction. In at least one embodiment, the turn-around time between the timing sign-off (e.g., at operation 1060) and the layout correction (e.g., at operation 1030 and/or operation 1040) is reduced compared to other approaches. In at least one embodiment, the RC extraction is performed without iteratively generating the mask layer containing the air gap patterns.

The above methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Figure 11:
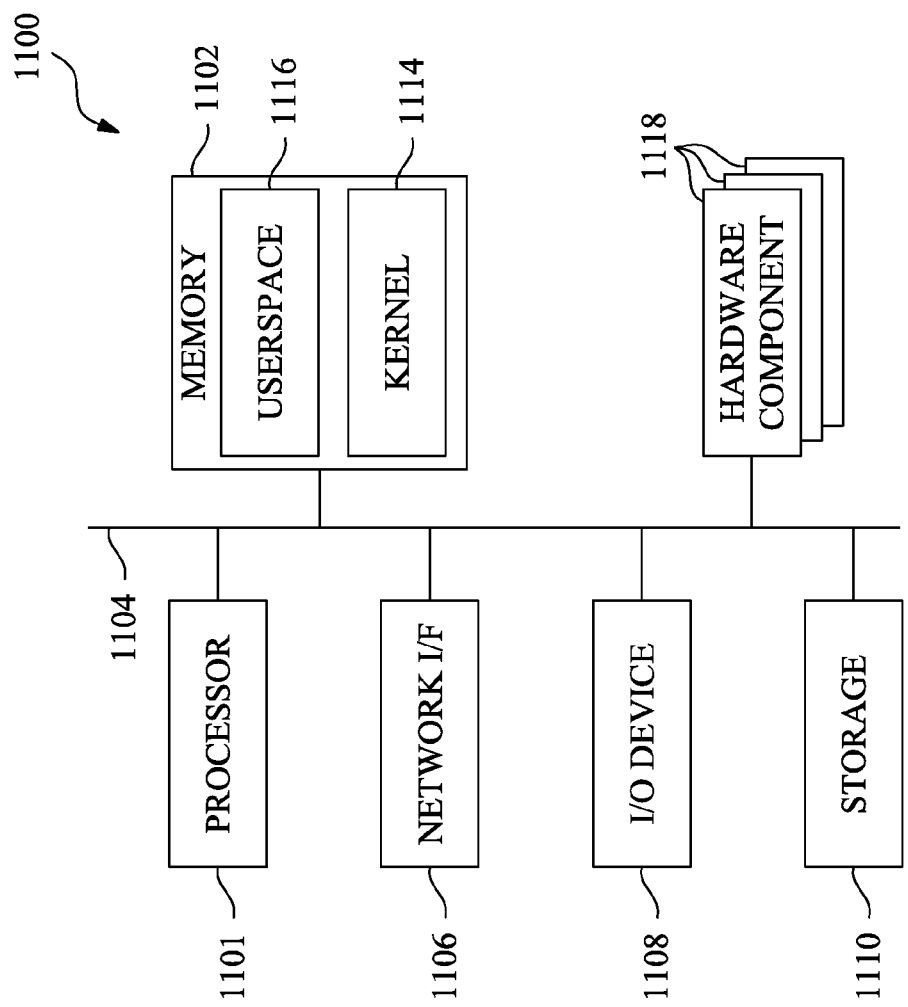
FIG. 11 is a block diagram of a computer system in accordance with some embodiments.

FIG. 11 is a block diagram of a computer system 1100 in accordance with some embodiments. One or more of the tools and/or engines and/or systems and/or operations described with respect to FIGS. 1-7 is realized in some embodiments by one or more computer systems 1100 of FIG. 11. The system 1100 comprises at least one processor 1101, a memory 1102, a network interface (I/F) 1106, a storage 1110, an input/output (I/O) device 1108 communicatively coupled via a bus 1104 or other interconnection communication mechanism.

The memory 1102 comprises, in some embodiments, a random access memory (RAM) and/or other dynamic storage device and/or read only memory (ROM) and/or other static storage device, coupled to the bus 1104 for storing data and/or instructions to be executed by the processor 1101, e.g., kernel 1114, userspace 1116, portions of the kernel and/or the userspace, and components thereof. The memory 1102 is also used, in some embodiments, for storing temporary variables or other intermediate information during execution of instructions to be executed by the processor 1101.

In some embodiments, a storage device 1110, such as a magnetic disk or optical disk, is coupled to the bus 1104 for storing data and/or instructions, e.g., kernel 1114, userspace 1116, etc. The I/O device 1108 comprises an input device, an output device and/or a combined input/output device for enabling user interaction with the system 1100. An input device comprises, for example, a keyboard, keypad, mouse, trackball, trackpad, and/or cursor direction keys for communicating information and commands to the processor 1101. An output device comprises, for example, a display, a printer, a voice synthesizer, etc. for communicating information to a user.

In some embodiments, one or more operations and/or functionality of the tools and/or engines and/or systems described with respect to FIGS. 1-7 are realized by the processor 1101, which is programmed for performing such operations and/or functionality. In some embodiments, the processor 1101 is configured as specifically configured hardware (e.g., one or more application specific integrated circuits (ASICs)). One or more of the memory 1102, the I/F 1106, the storage 1110, the I/O device 1108, the hardware components 1118, and the bus 1104 is/are operable to receive instructions, data, design constraints, design rules, netlists, layouts, models and/or other parameters for processing by the processor 1101.

In some embodiments, the operations and/or functionality are realized as functions of a program stored in a non-transitory computer readable recording medium. In at least one embodiment, the operations and/or functionality are realized as functions of a program, such as a set of executable instructions, stored in memory 1102. In at least one embodiment, the instructions stored in memory 1102 comprise functionality to implement at least one of the process flows described with respect to FIGS. 1, 3, 5, 7, 8 and 10. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In some embodiments, air gaps are inserted into a layout of an IC in accordance with lengths and/or other characteristics or cost functions of the nets in the IC. As a result, the effect of parasitic capacitance reduction due to air gap insertion is optimized in one or more embodiments.

In some embodiments, dummy nets are inserted into a layout of an IC to increase the air gap coverage in regions where air gaps are otherwise not insertable. In some embodiments, dummy nets and air gaps are inserted in accordance with lengths and/or other characteristics or cost functions of the nets in the IC. As a result, the effect of parasitic capacitance reduction due to air gap insertion is optimized in one or more embodiments.

In some embodiments, an RC estimation is performed with air gap consideration at the APR stage, even before air gaps are actually inserted into the layout. As a result, the APR stage outputs a layout optimized for subsequent air gap insertion which maximizes, or at least increases, performance benefit associated with air gap insertion.

In some embodiments, a corner-based RC extraction is performed with air gap consideration for critical signal paths of an IC, whereas an RC extraction without air gap consideration is performed other, less critical signal paths of the IC. As a result, design turn-around time is reduced while accuracy is assured by covering the corner cases.

In some embodiments, a method performed at least partially by a processor comprises performing an air gap insertion process. The air gap insertion process comprises sorting a plurality of nets of a layout of an integrated circuit in an order, and inserting, in accordance with the sorted order of the plurality of nets, air gap patterns adjacent to the plurality of nets. The method further comprises generating a modified layout of the integrated circuit. The modified layout comprises the plurality of nets and the inserted air gap patterns.

In some embodiments, a device comprises at least one processor configured to perform the following operations. A dummy net and air gap insertion process comprises sorting a plurality of nets of a layout of an integrated circuit in an order, and inserting, in accordance with the sorted order of the plurality of nets, dummy nets and air gap patterns adjacent to the plurality of nets. A modified layout of the integrated circuit is generated. The modified layout comprises the plurality of nets, the inserted dummy nets and the inserted air gap patterns.

In some embodiments, a computer program product comprises a non-transitory, computer-readable medium containing instructions therein which, when executed by at least one processor, cause the at least one processor to perform the following operations. Candidate nets for air gap insertion are selected among a plurality of nets of an integrated circuit. Various scaling ratios for the candidate nets are determined based on lengths of the corresponding candidate nets. Capacitances of the candidate nets are estimated based on the corresponding scaling ratios of the candidate nets. At least one of global routing, track assignment or detailed routing is performed based on the estimated capacitances of the candidate nets, to generate a layout of the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, the method performed at least partially by a processor, the method comprising:
   performing an air gap insertion process, the air gap insertion process comprising:
   sorting a plurality of nets of a layout of an integrated circuit in an order;
   inserting, in accordance with the sorted order of the plurality of nets, air gap patterns adjacent to the plurality of nets; and
   determining whether the air gap patterns that have been inserted satisfy an air gap density constraint;
   wherein the sorting of the plurality of nets is based on:

$$Cost4(i) = Cap\_Cost(i)/Length(i),$$

where $$Cap\_Cost(i) = \sum_{j=1}^{N} Proj\_Length(j) \times Cair\_gap + \sum_{k=1}^{P} Dummy\_Length(k) \times Cdummy$$

i indicates an i-th net among the plurality of nets,
   Length(i) is a length of the i-th net,
   N is a number of nets among the plurality of nets and adjacent the i-th net,
   j indicates a j-th net among the N nets adjacent the i-th net,
   Proj_Length(j) is a projection length over which the i-th net and the j-th net extend along each other,
   Cair_gap is a unit coupling capacitance between the i-th net and the j-th net,
   P is a number of dummy nets insertable adjacent the i-th net,
   k indicates a k-th dummy net among the P dummy nets insertable adjacent the i-th net,
   Dummy_Length(k) is a length of the k-th dummy net, and
   Cdummy is a unit coupling capacitance of the k-th dummy net;
   generating a modified layout of the integrated circuit, the modified layout comprising the plurality of nets and the inserted air gap patterns; and
   manufacturing the integrated circuit based on the modified layout.

2. The method of claim 1, wherein, in said sorting, the plurality of nets is further sorted based on at least one of:
   lengths of the plurality of nets, or
   projection lengths of adjacent nets among the plurality of nets, wherein the adjacent nets extend along each other over corresponding projection lengths.

3. The method of claim 1, wherein, in said sorting, the plurality of nets is further sorted based on at least one of $$Cost1(i) = \sum_{j=1}^{N} Proj\_Length(j), \text{ or}$$

$$Cost2(i) = Cost1(i)/Length(i),$$

where the
i indicates the i-th net among the plurality of nets,
N is the number of nets among the plurality of nets and adjacent the i-th net,
j indicates the j-th net among the N nets adjacent the i-th net,
Proj_Length(j) is the projection length over which the i-th net and the j-th net extend along each other, and
Length(i) is the length of the i-th net.

4. The method of claim 1, wherein the determining whether the air gap patterns that have been inserted satisfy the air gap density constraint is performed after inserting at least one air gap pattern adjacent to a net among the plurality of nets; and
wherein the air gap insertion process further comprises:
in response to a determination that the air gap patterns that have been inserted do not satisfy the air gap density constraint,
removing the inserted at least one air gap pattern, and proceeding to said generating the modified layout; and
in response to a determination that the air gap patterns that have been inserted satisfy the air gap density constraint,
inserting at least one further air gap pattern adjacent to a next net among the plurality of nets in accordance with the sorted order, and
returning to said determining.

5. The method of claim 1, wherein
the plurality of nets comprises signal nets and at least one dummy net, and
the method further comprises, prior to said air gap insertion process, inserting the at least one dummy net adjacent to at least one of the signal nets.

6. The method of claim 1, further comprising:
checking whether the modified layout of the integrated circuit satisfies a timing specification;
in response to a determination that the modified layout of the integrated circuit does not satisfy the timing specification,
identifying a failed signal path in the modified layout of the integrated circuit, and
performing said air gap insertion process for nets included in the failed signal path.

7. The method of claim 1, wherein, in said sorting, the plurality of nets is further sorted based on:

Cost5($i$)=Cap_Cost($i$)×Res_Cost($i$), where $$\text{Res\_Cost}(i) = \sum_{k=1}^{P} \text{Dummy\_Length}(k) \times Rdummy,$$

the i indicates the i-th net among the plurality of nets,
the j indicates the j-th net among the N nets adjacent the i-th net,
the P is the number of dummy nets insertable adjacent the i-th net,
the k indicates the k-th dummy net among the P dummy nets insertable adjacent the i-th net,
the Dummy_Length(k) is the length of the k-th dummy net, and
Rdummy is a unit resistance of the k-th dummy net.

8. A device, comprising at least one processor configured to at least partially perform:
a dummy net and air gap insertion process, the dummy net and air gap insertion process comprising:
sorting a plurality of nets of a layout of an integrated circuit in an order;
inserting, in accordance with the sorted order of the plurality of nets, dummy nets and air gap patterns adjacent to the plurality of nets; and
determining whether the air gap patterns that have been inserted satisfy an air gap density constraint;
wherein the sorting of the plurality of nets is based on:

Cost4($i$)=Cap_Cost($i$)/Length($i$), where $$\text{Cap\_Cost}(i) = \sum_{j=1}^{N} \text{Proj\_Length}(j) \times \text{Cair\_gap} + \sum_{k=1}^{P} \text{Dummy\_Length}(k) \times Cdummy$$

i indicates an i-th net among the plurality of nets,
Length(i) is a length of the i-th net,
N is a number of nets among the plurality of nets and adjacent the i-th net,
j indicates a j-th net among the N nets adjacent the i-th net, Proj_Length(j) is a projection length over which the i-th net and the j-th net extend along each other,
Cair gap is a unit coupling capacitance between i-th net and the j-th net,
P is a number of dummy nets insertable adjacent the i-th net,
k indicates a k-th dummy net among the P dummy nets insertable adjacent the i-th net,
Dummy_Length(k) is a length of the k-th dummy net, and
Cdummy is a unit coupling capacitance of the k-th dummy net;
generating a modified layout of the integrated circuit, the modified layout comprising the plurality of nets, the inserted dummy nets and the inserted air gap patterns; and
manufacturing the integrated circuit based on the modified layout.

9. The device of claim 8, wherein said inserting comprises:
inserting at least one dummy net adjacent to a net among the plurality of nets;
inserting at least one air gap pattern between the inserted at least one dummy net and the corresponding net; and
inserting at least one further air gap pattern between the corresponding net and an adjacent net among the plurality of nets.

10. The device of claim 8, wherein, in said sorting, the plurality of nets is further sorted based on:

Cost5($i$)=Cap_Cost($i$)×Res_Cost($i$), where $$\text{Res\_Cost}(i) = \sum_{k=1}^{P} \text{Dummy\_Length}(k) \times Rdummy,$$

the i indicates the i-th net among the plurality of nets,
the j indicates the j-th net among the N nets adjacent the i-th net, the P is the number of dummy nets insertable adjacent the i-th net, the k indicates the k-th dummy net among the P dummy nets insertable adjacent the i-th net, the Dummy_Length(k) is the length of the k-th dummy net, and Rdummy is a unit resistance of the k-th dummy net.

11. The device of claim 8, wherein the determining whether the air gap patterns that have been inserted satisfy the air gap density constraint is performed after inserting at least one dummy net adjacent to a net among the plurality of nets and inserting at least one air gap pattern between the inserted at least one dummy net and the corresponding net; and wherein the dummy net and air gap insertion process further comprises:
in response to a determination that the air gap patterns that have been inserted do not satisfy the air gap density constraint,
removing the inserted at least one air gap pattern, and proceeding to said generating the modified layout; and
in response to a determination that the air gap patterns that have been inserted satisfy the air gap density constraint,
inserting at least one further dummy net adjacent to a next net among the plurality of nets in accordance with the sorted order,
inserting at least one further air gap pattern between the at least one further dummy net and the next net, and
returning to said determining.

12. The device of claim 8, wherein the determining whether the air gap patterns that have been inserted satisfy the air gap density constraint is performed after inserting at least one dummy net adjacent to a net among the plurality of nets and inserting at least one air gap pattern between the inserted at least one dummy net and the corresponding net; and wherein the dummy net and air gap insertion process further comprises:
in response to a determination that the air gap patterns that have been inserted do not satisfy the air gap density constraint,
removing the inserted at least one dummy net,
removing the inserted at least one air gap pattern, and proceeding to said generating the modified layout; and
in response to a determination that the air gap patterns that have been inserted satisfy the air gap density constraint,
inserting at least one further dummy net adjacent to a next net among the plurality of nets in accordance with the sorted order,
inserting at least one further air gap pattern between the at least one further dummy net and the next net, and
returning to said determining.

13. The device of claim 8, wherein the at least one processor is further configured to perform:
checking whether the modified layout of the integrated circuit satisfies a timing specification;
in response to a determination that the modified layout of the integrated circuit does not satisfy the timing specification,
identifying a failed signal path in the modified layout of the integrated circuit, and
performing said dummy net and air gap insertion process for nets included in the failed signal path.

14. The device of claim 8, wherein said inserting comprises
inserting at least one dummy net between adjacent first and second nets among the plurality of nets, wherein
a spacing between the adjacent first and second nets is greater than a maximum spacing for air gap insertion,
a spacing between (i) the at least one dummy net and (ii) at least one of the first net or the second net is not greater than the maximum spacing for air gap insertion, and
inserting at least one air gap pattern between (i) the at least one dummy net and (ii) said at least one of the first net or the second net.

15. A method, the method performed at least partially by a processor, the method comprising:
selecting, among a plurality of nets of an integrated circuit, candidate nets for air gap insertion;
determining various scaling ratios for the candidate nets based on lengths of the corresponding candidate nets, wherein the various scaling ratios are based on influences of air gaps on capacitances of the corresponding candidate nets;
estimating the capacitances of the candidate nets based on corresponding scaling ratios of the candidate nets;
at least one of global routing, track assignment or detailed routing, based on the estimated capacitances of the candidate nets, to generate a layout of the integrated circuit; and
manufacturing the integrated circuit based on the layout.

16. The method of claim 15, wherein
for candidate nets having corresponding lengths less than a first threshold length, the corresponding scaling ratios have a first scaling ratio value,
for candidate nets having the corresponding lengths greater than a second threshold length, the corresponding scaling ratios have a second scaling ratio value less than the first scaling ratio value, and
for candidate nets having the corresponding lengths not less than the first threshold length and not greater than the second threshold length, the corresponding scaling ratios decrease from the first scaling ratio value to the second scaling ratio value as the corresponding lengths increase from the first threshold length to the second threshold length.

17. The method of claim 15, further comprising:
inserting at least one dummy net between adjacent first and second nets among the plurality of nets of the layout, wherein
a spacing between the adjacent first and second nets is greater than a maximum spacing for air gap insertion, and
a spacing between (i) the at least one dummy net and (ii) at least one of the first net or the second net is not greater than the maximum spacing for air gap insertion; and
inserting at least one air gap pattern between (i) the at least one dummy net and (ii) said at least one of the first net or the second net, to generate a modified layout of the integrated circuit, the modified layout comprising the plurality of nets, the inserted at least one dummy net and the inserted at least one air gap pattern.

18. The method of claim 17, further comprising:
sorting the plurality of nets of the layout in an order; and
performing said inserting the at least one dummy net in accordance with the sorted order of the plurality of nets.

19. The method of claim 15, further comprising:
inserting dummy nets and air gap patterns in the layout of the integrated circuit;
identifying a signal path in the layout of the integrated circuit, the signal path including at least one of the air gap patterns;
calculating a first time delay of the signal path based on at least one capacitance of the signal path extracted with consideration of the at least one air gap pattern in the signal path;
calculating a second time delay of the signal path based on at least one capacitance of the signal path extracted without consideration of the at least one air gap pattern in the signal path, and a dielectric constant;
adjusting the dielectric constant to match the second time delay to the first time delay; and
adjusting capacitances of other signal paths in the layout of the integrated circuit based on the adjusted dielectric constant at which the second time delay matches the first time delay.

20. The method of claim 19, wherein said adjusting the dielectric constant comprises:
decreasing the dielectric constant when the second time delay is greater than the first time delay, and
increasing the dielectric constant when the second time delay is less than the first time delay.

\* \* \* \* \*